United States Patent
Narita

(10) Patent No.: US 10,090,829 B2
(45) Date of Patent: Oct. 2, 2018

(54) SEMICONDUCTOR INTEGRATED CIRCUIT DEVICE

(71) Applicant: RENESAS ELECTRONICS CORPORATION, Koutou-ku, Tokyo (JP)

(72) Inventor: Koki Narita, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 290 days.

(21) Appl. No.: 14/893,059

(22) PCT Filed: May 21, 2013

(86) PCT No.: PCT/JP2013/064089
§ 371 (c)(1),
(2) Date: Nov. 21, 2015

(87) PCT Pub. No.: WO2014/188514
PCT Pub. Date: Nov. 27, 2014

(65) Prior Publication Data
US 2016/0126942 A1    May 5, 2016

(51) Int. Cl.
*H02H 3/22* (2006.01)
*H03K 17/081* (2006.01)
(Continued)

(52) U.S. Cl.
CPC ... *H03K 17/08104* (2013.01); *H01L 27/0255* (2013.01); *H01L 27/0292* (2013.01);
(Continued)

(58) Field of Classification Search
USPC .......................................... 361/56, 91.1, 111
See application file for complete search history.

(56) References Cited

U.S. PATENT DOCUMENTS 6,144,542 A * 11/2000 Ker ..................... H01L 27/0251
361/111
9,197,061 B2 * 11/2015 Russ ..................... H02H 9/046
(Continued)

FOREIGN PATENT DOCUMENTS

JP    2002-64150 A    2/2002
JP    2003-218682 A    7/2003
(Continued)

OTHER PUBLICATIONS

Office Action dated Jul. 19, 2017, in Chinese Patent Application No. 201380076746.4.
(Continued)

*Primary Examiner* — Danny Nguyen
(74) *Attorney, Agent, or Firm* — Shapiro, Gabor and Rosenberger, PLLC

(57) ABSTRACT

A semiconductor integrated circuit device is provided with first and second regions that are operated by mutually different voltages, and a signal wiring that supplies a signal from the first region to the second region. The second region includes a circuit that is connected to between a first wiring to which a voltage is selectively supplied and a third terminal to which a voltage is supplied, and is operated by a differential voltage between the voltage in the first wiring and the voltage supplied to the third terminal, and a discharge circuit for discharging a charge in the first wiring. By using the discharge circuit, the potential difference between the signal wiring and the first wiring is prevented from becoming larger, and thus makes it possible to reduce damages of the circuit included in the second region.

11 Claims, 15 Drawing Sheets

(51) Int. Cl.
    *H01L 27/06* (2006.01)
    *H01L 27/08* (2006.01)
    *H01L 27/02* (2006.01)
    *H02H 9/04* (2006.01)
    *H03K 5/08* (2006.01)

(52) U.S. Cl.
    CPC ...... *H01L 27/0296* (2013.01); *H01L 27/0629* (2013.01); *H01L 27/0814* (2013.01); *H02H 9/046* (2013.01); *H03K 5/08* (2013.01)

(56) References Cited

U.S. PATENT DOCUMENTS

| | | |
|---|---|---|
| 2003/0141926 A1 | 7/2003 | Mizuno et al. |
| 2006/0077601 A1 | 4/2006 | Ikeda et al. |
| 2009/0135534 A1* | 5/2009 | Ishii .................. H01L 27/0251 361/56 |
| 2010/0165776 A1 | 7/2010 | Tada |
| 2011/0102954 A1 | 5/2011 | Arai et al. |

FOREIGN PATENT DOCUMENTS

| | | |
|---|---|---|
| JP | 2006-100606 A | 4/2006 |
| JP | 2007-116054 A | 5/2007 |
| JP | 2010-80472 A | 4/2010 |
| JP | 2010-225782 A | 10/2010 |
| JP | 2011-096879 A | 5/2011 |
| WO | WO 2007/099841 A1 | 7/2009 |

OTHER PUBLICATIONS

International Search Report from International Patent Application No. PCT/JP2013/064089, dated Jun. 18, 2013.

Written Opinion of the International Searching Authority from PCT/JP2013/064089, dated Jun. 18, 2013.

Office Action, dated Mar. 14, 2018, in Taiwanese Patent Application No. 103117690.

* cited by examiner

SEMICONDUCTOR INTEGRATED CIRCUIT DEVICE

TECHNICAL FIELD

The present invention relates to a semiconductor integrated circuit device, and in particular relates to such a semiconductor integrated circuit device in which a plurality of circuits operated by mutually different voltages as power-supply voltages are formed on one semiconductor chip.

BACKGROUND ART

Along with the development of a semiconductor manufacturing process for manufacturing semiconductor integrated circuit devices, a field-effective type transistor (hereinafter, referred to as MOSFET) for use in constituting a circuit formed in the semiconductor chip has been further miniaturized. By the miniaturization of the MOSFET, a gate oxide film to be formed between a gate of the MOSFET and a semiconductor substrate is made further thinner. As the gate oxide film is made further thinner, the withstand voltage against breakdown relative to a voltage applied to the gate is lowered conspicuously. As the voltage applied to the gate, a high voltage generated by static electricity that is generated upon transportation or handling of the semiconductor integrated circuit device is included. For this reason, an electrostatic damage (ESD) test is executed on the semiconductor integrated circuit device so as to improve portions in which the withstand voltage against breakdown is lowered.

As such an electrostatic damage test, a CDM (Charged Device Model) test is carried out. The CDM is one of electrostatic discharge models in the semiconductor integrated circuit device. In the CDM test, the entire semiconductor integrated circuit device is set to an electrified state, and a test-use terminal is selected from a plurality of terminals disposed on the semiconductor integrated circuit device, so that a metal terminal is made in contact with the selected terminal. When made in contact therewith, the metal terminal is supplied with a ground voltage of the circuit. By this contact, the electrified charge is discharged through the selected test-use terminal so that the CDM withstand voltage is evaluated.

In the CDM test, in circuits that receive signals from circuits that are operated by different power-supply voltages, the gate of the MOSFET tends to be damaged. Patent Document 1 has disclosed a technique for preventing the electrostatic damage of the gate caused by the CDM test by using a small number of protective circuits.

RELATED ART DOCUMENT

Patent Document

Patent Document 1: Japanese Patent Application Publication Laid-Open No. 2006-100606

SUMMARY OF THE INVENTION

Problems to be Solved by the Invention

In FIG. 1, Patent Document 1 shows a semiconductor integrated circuit device including a circuit block [1] that is operated by a power-supply voltage Vdd1 and a reference voltage Vss1 and a circuit block [2] that is operated by a power-supply voltage Vdd2 and a reference voltage Vss2. In Patent Document 1, a clamp circuit [1] that carries out a clamping process between the power-supply voltage Vdd1 and the reference voltage Vss2 and a clamp circuit [2] that carries out a clamping process between the power-supply voltage Vdd2 and the reference voltage Vss1 are provided. Moreover, a clamp circuit [3] that carries out a clamping process between the reference voltage Vss1 and the reference voltage Vss2 is provided. With this arrangement, among electrostatic damages caused among a plurality of power supplies (between power supplies: Vdd1, Vss1 and power supplies: Vdd2, Vss2), in particular, electrostatic damages caused in a CDM can be prevented by using small number of protective circuits.

On the other hand, in recent years, a demand for low power consumption of semiconductor integrated circuit devices has become further stronger, and in particular, the demand for the low power consumption of the semiconductor integrated circuit devices such as a SoC used for portable (mobile) devices, has become stronger. In response to the demand, to the semiconductor integrated circuit device for use in portable devices, a so-called power-supply interrupting technique has been introduced. In this power-supply interrupting technique, a power-supply interrupting switch circuit is provided in each of the plurality of circuits constituting the semiconductor integrated circuit device. The power-supply interrupting switch circuit is controlled so as not to supply power to circuits that need not be operated at that time. Thus, the number of circuits to be operated at the same time is reduced to achieve the low power consumption. In this case, the power-supply interrupting switch circuit is commonly provided in a plurality of circuits by taking into consideration, the area and/or controllability in the semiconductor chip to be occupied by the corresponding circuit.

When such a plurality of circuits are regarded as one region, a plurality of the regions for use in power-supply interruption (power-supply interrupting regions) are installed in the semiconductor integrated circuit device. For this reason, signal wirings for use in transmitting signals to be processed (or to be produced) are made to be connected to between mutually different power-supply interrupting regions.

The inventors of the present application have examined breakdown of MOSFETs in circuits that are operated by mutually different power-supply voltages and disposed on mutually different power-supply interrupting regions. The following description will discuss the examination carried out by the inventors.

FIG. 14 is a circuit diagram formed by the inventors so as to examine a semiconductor integrated circuit device described in FIG. 1 of Patent Document 1. For this reason, this circuit diagram also includes examination matters of the inventors. In FIG. 14, reference numeral 1400 indicates a terminal to which a voltage VDD2 serving as a power-supply voltage for operating a circuit block 2 is applied, and reference numeral 1401 indicates a terminal to which a voltage VSS2 serving as a reference voltage (ground voltage) of a circuit block 2 is applied. Moreover, reference numeral 1402 indicates a terminal to which a voltage VDD1 serving as a power-supply voltage for operating a circuit block 1 is applied, and reference numeral 1403 indicates a terminal to which a voltage VSS1 serving as a reference voltage (ground voltage) of the circuit block 1 is applied. That is, the circuit block 1(2) is operated by a differential voltage between the voltage VDD2 and the voltage VSS2 (voltage VDD1 and voltage VSS1).

The circuit block 1 is indicated as a circuit configured by a P-channel-type MOSFET (hereinafter, referred to as P-FET) 1406 and an N-channel-type MOSFET (hereinafter, referred to as N-FET) 1407. That is, the source of the P-FET 1406 is connected to the terminal 1402, the source of the N-FET 1407 is connected to the terminal 1403, and the respective drains of the P-FET 1406 and the N-FET 1407 are commonly connected to a signal wiring 1413 respectively. Additionally, although not shown in the figure, an input signal is supplied to each of the gates of the P-FET 1406 and the N-FET 1407. Moreover, back gates of the P-FET 1406 and the N-FET 1407, which are respectively indicated by arrows, are connected to the respective sources.

The circuit block 2 is indicated as an inverter circuit configured by a P-FET 1404 and an N-FET 1405. That is, the source of the P-FET 1404 is connected to the terminal 1400, the source of the N-FET 1405 is connected to the terminal 1401, and drains of the P-FET 1404 and the N-FET 1405 are commonly connected respectively. The gate of the P-FET 1404 and the gate of the P-FET 1405 are commonly connected to the signal wiring 1413. Moreover, back gates of the P-FET 1404 and the N-FET 1405, which are respectively indicated by arrows, are connected to the respective sources.

In the figure, respective circuits 1408 to 1410 are clamp circuits, and the clamp circuit 1408 corresponds to a clamp circuit (1)13a in FIG. 1 of Patent Document 1, the clamp circuit 1409 corresponds to a clamp circuit (2) 13b thereof, and the clamp circuit 1410 corresponds to a clamp circuit (3)13c thereof.

In the case when in a CDM test, the semiconductor integrated circuit device is electrified and the terminal 1402 is selected as a terminal for use in the test, as indicated as the CDM in the figure, a metal terminal is made in contact with the terminal 1402, so that a ground voltage is applied to the terminal 1402.

Upon application of the ground voltage, charges accumulated in the respective gates of the P-FET 1404 and the N-FET 1405 and those accumulated in the signal wiring 1413 are discharged to the terminal 1402 through the signal wiring 1413 and the P-FET 1406. The route for this discharge is indicated by a broken line 1412 in the figure. Moreover, a charge accumulated in the source of the N-FET 1405 is discharged to the terminal 1402 through the clamp circuit 1408. The discharge route is indicated by a broken line 1411. In this manner, the charge applied to the semiconductor chip is discharged from the terminal 1402. Additionally, in the figure, the charge is schematically indicated in a manner so as to "surround—with a circle".

FIG. 15 is a circuit diagram showing a circuit in the case when two power-supply interrupting regions having mutually different supplied voltages are electrically connected to each other by a signal wiring. In the figure, those portions that are the same as those shown in FIG. 14 are indicated by the same reference numerals. The power-supply interrupting regions (or between circuits) that receive different voltages as power-supply voltages and are operated respectively are connected by a signal wiring, and a signal to be transmitted through the connected signal wiring is referred to as a different-power-supply bridging signal in the present specification.

One power-supply interrupting region of the two power-supply interrupting regions includes the circuit block 2 having the P-FET 1404 and N-FET 1405 in the same manner as in FIG. 14. Moreover, in the power-supply interrupting region, an N-FET 1502 corresponding to a power-supply interrupting switch circuit is provided between the terminal 1401 receiving a voltage VSS2 that serves as the ground voltage of the circuit and the circuit block 2. That is, the source of the N-FET 1502 is connected to the terminal 1401, and the drain thereof is connected to the circuit block 2. Moreover, a control signal for use in turning on/off the N-FET serving as the power-supply interrupting switch circuit is supplied to the gate of the N-FET 1502.

The circuit block 2 includes a plurality of circuits that are connected in parallel with each other between the terminal 1400 and the wiring VSSM2. Moreover, each of the plurality of circuits includes a plurality of MOSFETs for constituting the circuit. It should be understood that the above-mentioned MOSFETs 1404 and 1405 indicate MOSFETs included in one circuit of the above-mentioned plurality of circuits. Furthermore, in the figure, an N-FET 1504 is indicated as an example of an MOSFET included in the other circuit of the above-mentioned plurality of circuits. The N-FET 1502 serving as the power-supply interrupting switch circuit supplies the voltage VSS2 to the above-mentioned plurality of circuits when turned on.

That is, the voltage VSS2 is supplied to a plurality of MOSFETs (for example, 1405 and 1504) included in the plurality of circuits. In order to connect the plurality of MOSFETs (the plurality of N-FETs in this example) to the N-FET 1502 for use in power-supply interruption, the drain of the N-FET 1502 is connected to a wiring (hereinafter, also referred to as an interrupting power-supply wiring so as to be separated from the power-supply voltage wiring and the ground voltage wiring) VSSM2. The plurality of MOSFETs (N-FETs) are connected to this interrupting power-supply wiring VSSM2. In this example, the sources of the plurality of N-NETs are connected to the interrupting power-supply wiring VSSM2.

Moreover, the N-FET 1502 serving as a switch circuit has its physical size set to be large so as to be able to supply the ground voltage VSS2 to the plurality of MOSFETs. In the present specification, the MOSFET included in the circuit block has its portion corresponding to the gate indicated as a box having a rectangular shape so as to indicate that it is the MOSFET having a large physical size. Additionally, although not particularly limited, the back gate of the N-FET 1502 for use in power-supply interruption is connected to the terminal 1401.

The gate of the P-FET 1404 and the gate of the N-FET 1405 in the circuit block 2 are commonly connected, and a different power-supply bridging signal is supplied from the other power-supply interrupting region of the two power-supply interrupting regions. In the figure, an example including the circuit block 1 shown in FIG. 14 is indicated as the other power-supply interruption region.

Since the circuit block 1 has been explained in FIG. 14, the detailed description thereof will be omitted; however, the circuit block 1 also includes a plurality of FETs other than the MOSFETs 1406 and 1407 in the same manner as in the circuit block 2. An N-FET 1503 serving as a power-supply interrupting switch circuit is provided in the circuit block 1 including the plurality of MOSFETS. In the same manner as in the above-mentioned one of the power-supply interrupting regions, the sources of the plurality of N-FETs in the circuit block 1 are connected to an interrupting power-supply wiring VSSM1, and the N-FET 1503 is connected to between the interrupting power-supply wiring VSSM1 and the terminal 1403.

Moreover, the clamp circuits 1408 to 1410 shown in FIG. 14 are connected to between the terminals 1400 to 1403 in the same manner as in FIG. 14.

In this configuration, in the same manner as in the case of FIG. 14, when the entire semiconductor integrated circuit device is electrified, with the terminal 1402 being made in contact with a metal terminal having the ground voltage, the following phenomenon is generated. That is, in the same manner as explained with reference to FIG. 14, a charge is accumulated in the signal wiring 1413 for use in transmitting a signal (the difference power-supply bridging signal in FIG. 15) and the gates of the MOSFETs 1404 and 1405. When the metal terminal is made in contact therewith, the electrified charge is allowed to reach the terminal 1402 via a path indicated by a broken line 1412 through the signal wiring 1413 to be discharged.

On the other hand, as explained in FIG. 14, a charge is also accumulated by electrification in the source of the N-FET 1405 in the circuit block 2. In the case of FIG. 15, a switch circuit for use in power-supply interruption is provided, so that a charge is electrified in the source of each of the plurality of N-FETs. Moreover, a charge is also accumulated by electrification in the interrupting power-supply wiring VSSM2 for use in commonly connecting the sources of the plurality of N-FETs. In this case, the interrupting power-supply wiring VSSM2 has its length and width set to be comparatively large so as to connect the sources of the plurality of N-FETs and to be able to supply the ground voltage VSS2 thereto. Consequently, the parasitic capacitance possessed by the interrupting power-supply wiring VSSM2 also has a comparatively large value.

In this manner, the charge accumulated in the parasitic capacitance of the interrupting power-supply wiring VSSM2 and the charge accumulated in each of the sources of the plurality of FETs connected to the interrupting power-supply wiring VSSM2 are discharged to the terminal 1402 through the N-FET 1502 for use in power-supply interruption and the clamp circuit 1408, as indicated by a broken line 1411, when the metal terminal is made in contact therewith. In this case, however, a total amount of the charge accumulated in the parasitic capacitance of the interrupting power-supply wiring VSSM2 and the charge accumulated in the source of each of the plurality of N-FETs including the N-FET 1405 becomes larger in comparison with the case where no power-supply interrupting regions are provided. Moreover, the discharge is carried out through a switching circuit for use in power-supply interruption. For this reason, when the metal terminal is made in contact with the terminal 1402, a long period of time is required for discharging these charges. That is, the change in the potential of the interrupting power-supply wiring VSSM2, in other words, the change in the potential of the source of the N-FET 1405, becomes slower. On the other hand, the potential of the gate of the N-FET 1405 is changed in the same manner as in the case of FIG. 14, even when the switch circuit for use in power-supply interruption is provided. For this reason, the potential difference between the source and the gate of the N-FET 1405 becomes larger, with the result that the gate of the N-FET 1405 might be damaged. In particular, along with the development of the semiconductor manufacturing process, when the progress of miniaturization of the FETs is further made, more damages might occur due to degradation in the gate withstand voltage of the FETs.

As described above, the examinations of the inventors of the present invention have found that in the case when a signal transmission is made between a plurality of power-supply interrupting regions, which are operated by mutually different voltages, with the use of a different power-supply bridging signal, a new problem is raised.

In Patent Document 1, no attention is paid to damages of FETs in a plurality of power-supply interrupting regions that are operated by mutually different voltages.

The above and other objects and novel characteristics of the present invention will be apparent from the description of the present specification and the accompanying drawings.

Means for Solving the Problems

A semiconductor integrated circuit device is provided with first and second regions that are operated by mutually different voltages, and a signal wiring that supplies a signal from the first region to the second region. The second region includes a circuit that is connected to between a first wiring to which a voltage is selectively supplied and a third terminal to which a voltage is supplied, and is operated by a differential voltage between the voltage in the first wiring and the voltage supplied to the third terminal, and a discharge circuit for discharging a charge in the first wiring. By using the discharge circuit, the potential difference between the signal wiring and the first wiring is prevented from becoming larger, and thus makes it possible to reduce damages of the circuit included in the second region.

In accordance with one embodiment, a switch circuit is provided between the first wiring and the third terminal. Further, a clamp circuit is provided between the second terminal and the third terminal for use in supplying a power-supply voltage to circuits included in the first region. A charge in the first wiring s discharged through the switch circuit and the clamp circuit. With this arrangement, the potential difference between the signal wiring and the first wiring is further prevented from becoming larger.

Moreover, in accordance with one embodiment, the circuit included in the second region includes a plurality of MOSFETs that are connected to the first wiring. By selectively supplying a voltage to the first wiring, it is possible to achieve low power consumption.

Effects of the Invention

In accordance with the embodiment, it becomes possible to provide a semiconductor integrated circuit device capable of reducing the occurrence of electrostatic breakdown.

BRIEF DESCRIPTIONS OF THE DRAWINGS

Figure 7:
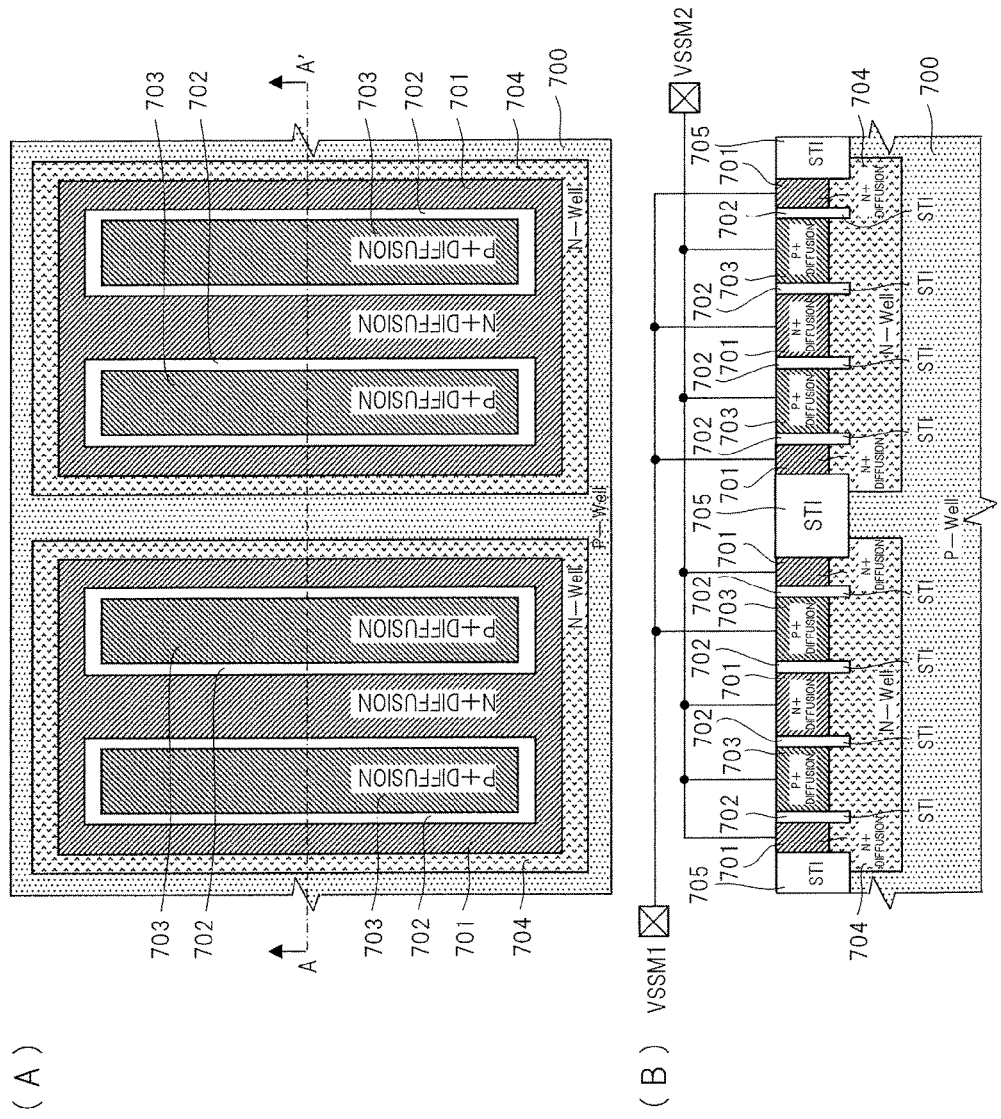

FIGS. 7(A) and (B) are structural drawings showing a configuration of a discharge circuit.

Figure 8:
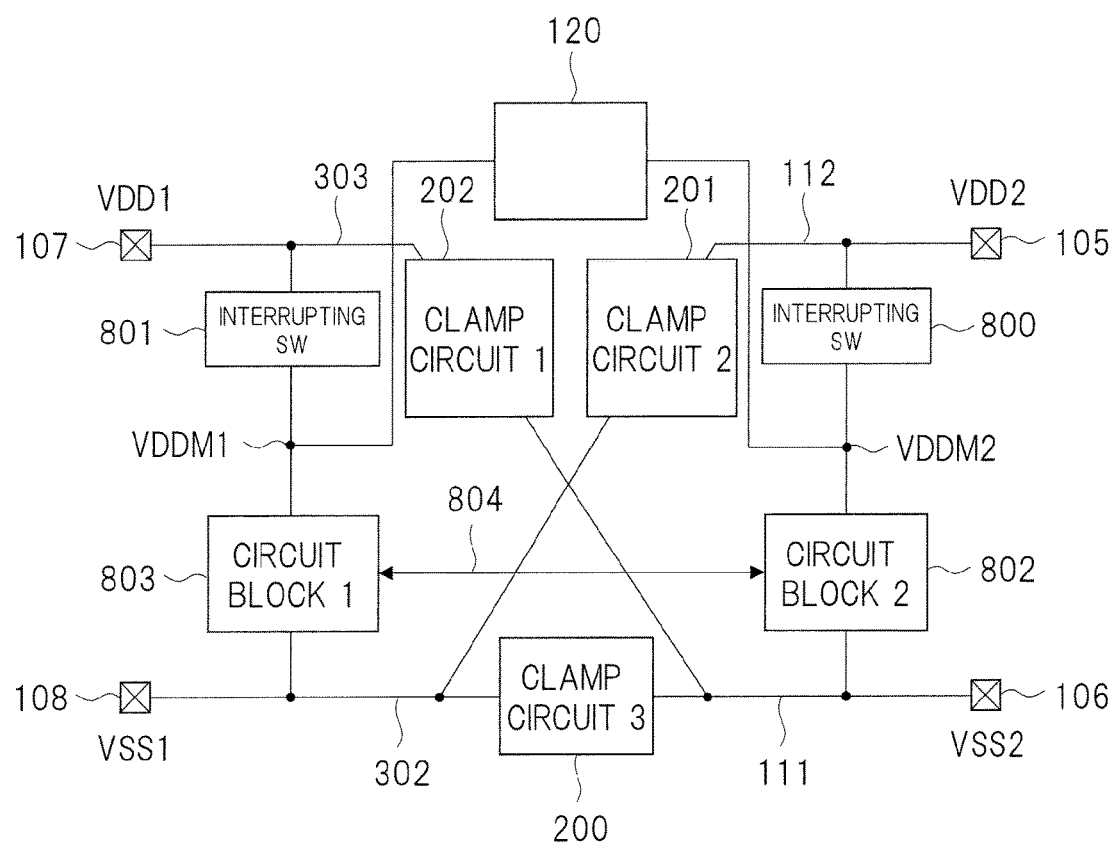

FIG. 8 is a block diagram showing a configuration of a semiconductor integrated circuit device in accordance with a second embodiment.

Figure 9:
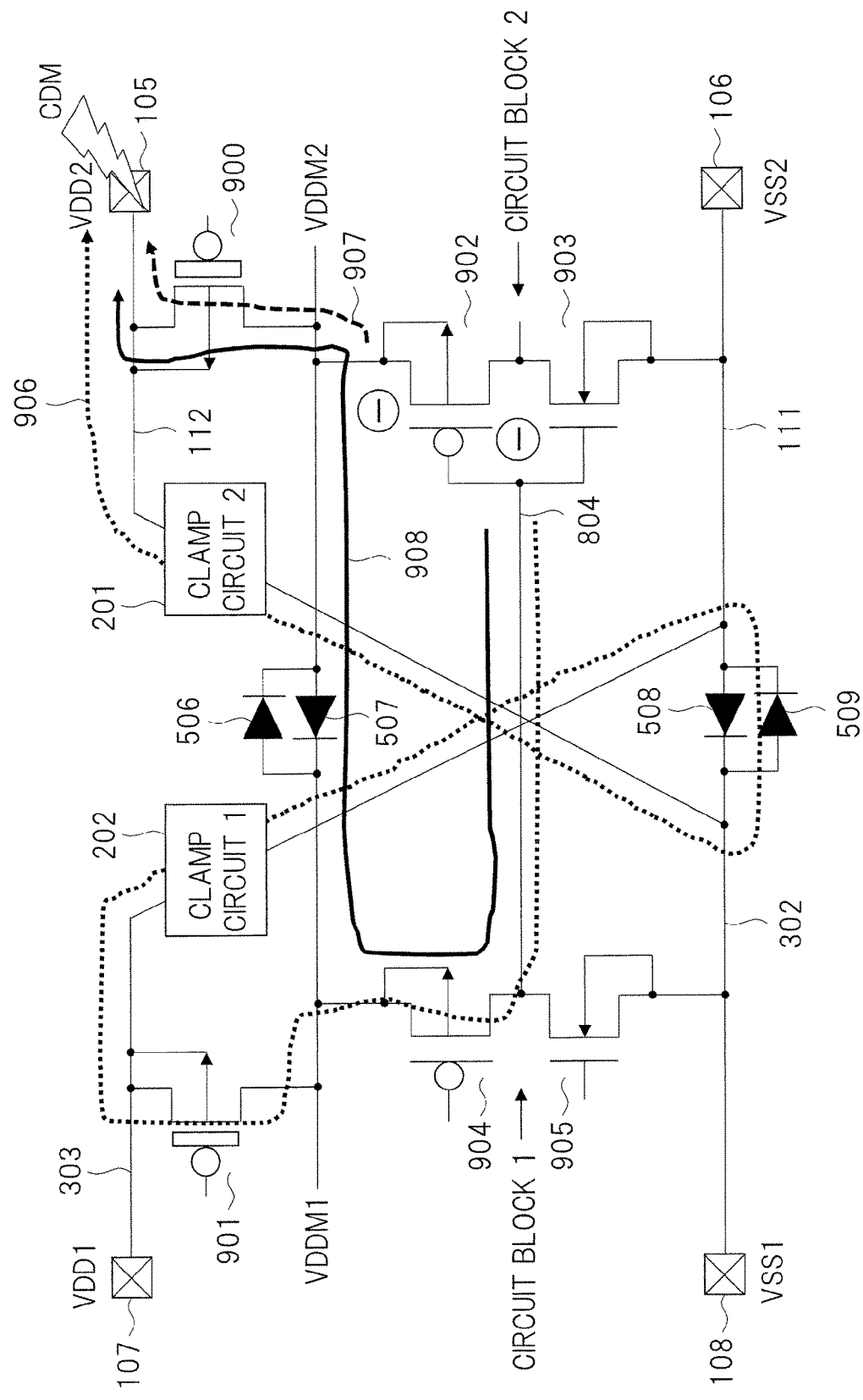

FIG. 9 is a circuit diagram showing a configuration of the semiconductor integrated circuit device in accordance with the second embodiment.

Figure 10:
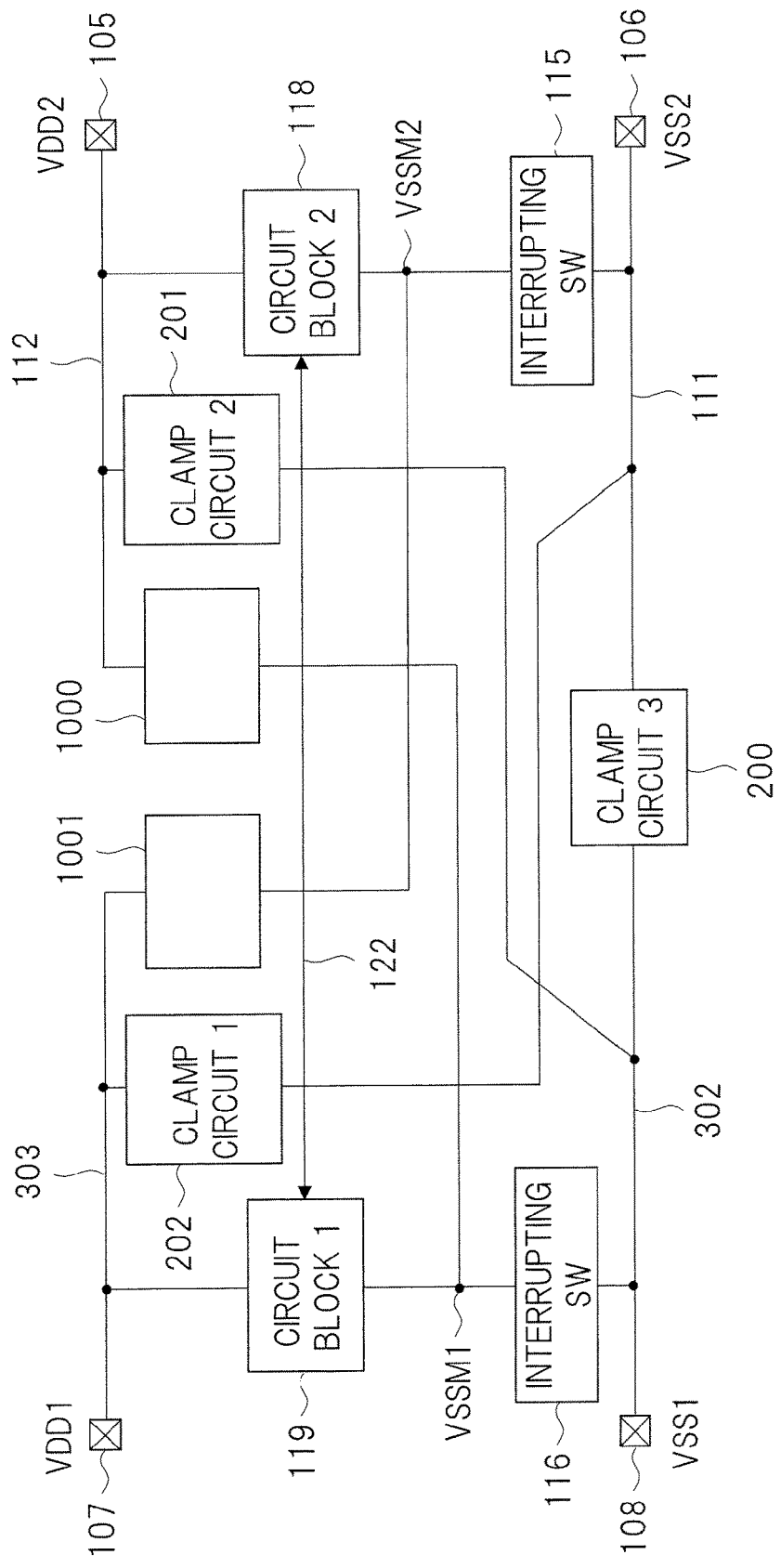

FIG. 10 is a block diagram showing a configuration of a semiconductor integrated circuit device in accordance with a third embodiment.

Figure 11:
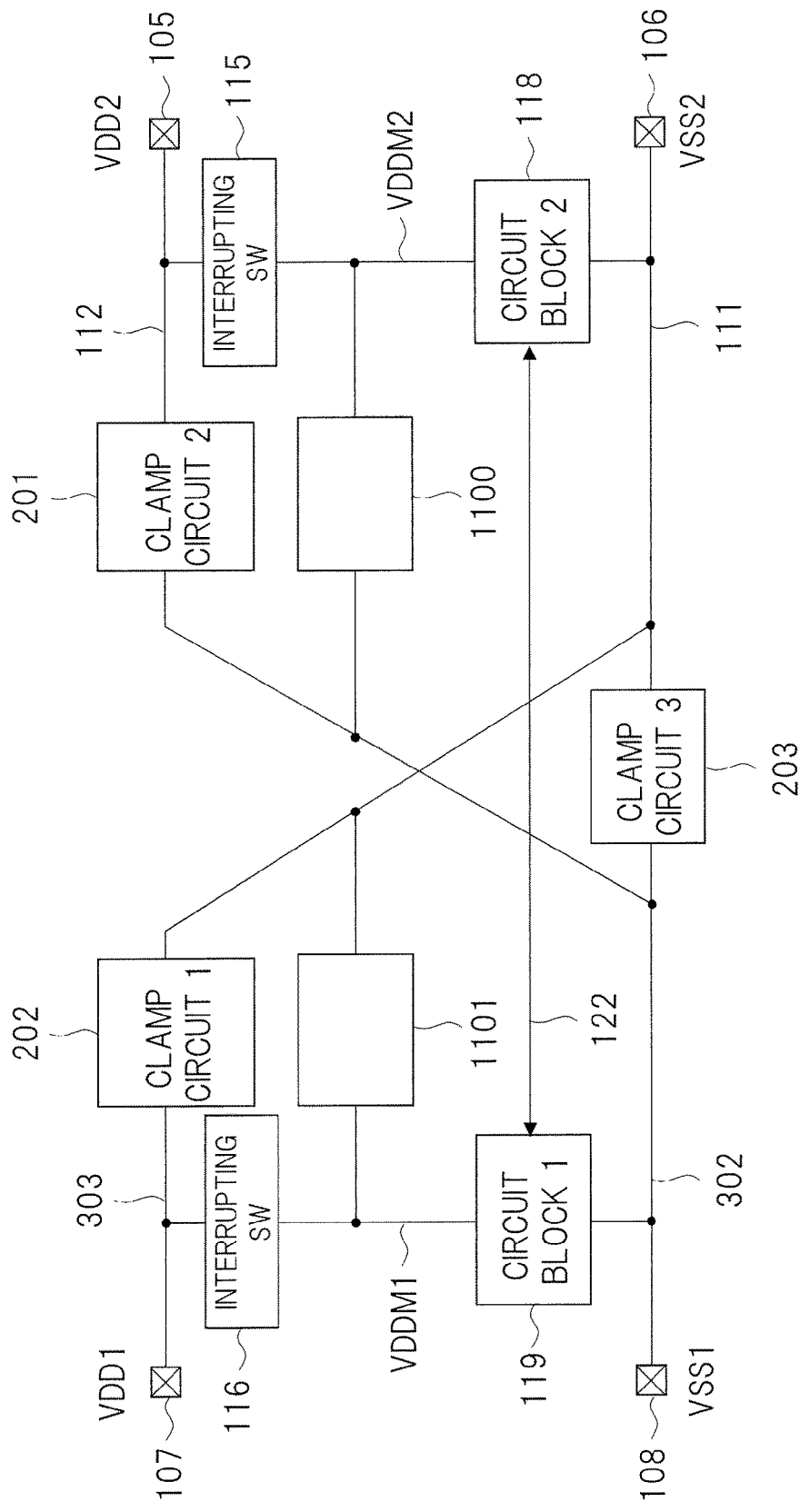

FIG. 11 is a block diagram showing a configuration of a semiconductor integrated circuit device in accordance with a fourth embodiment.

Figure 12:
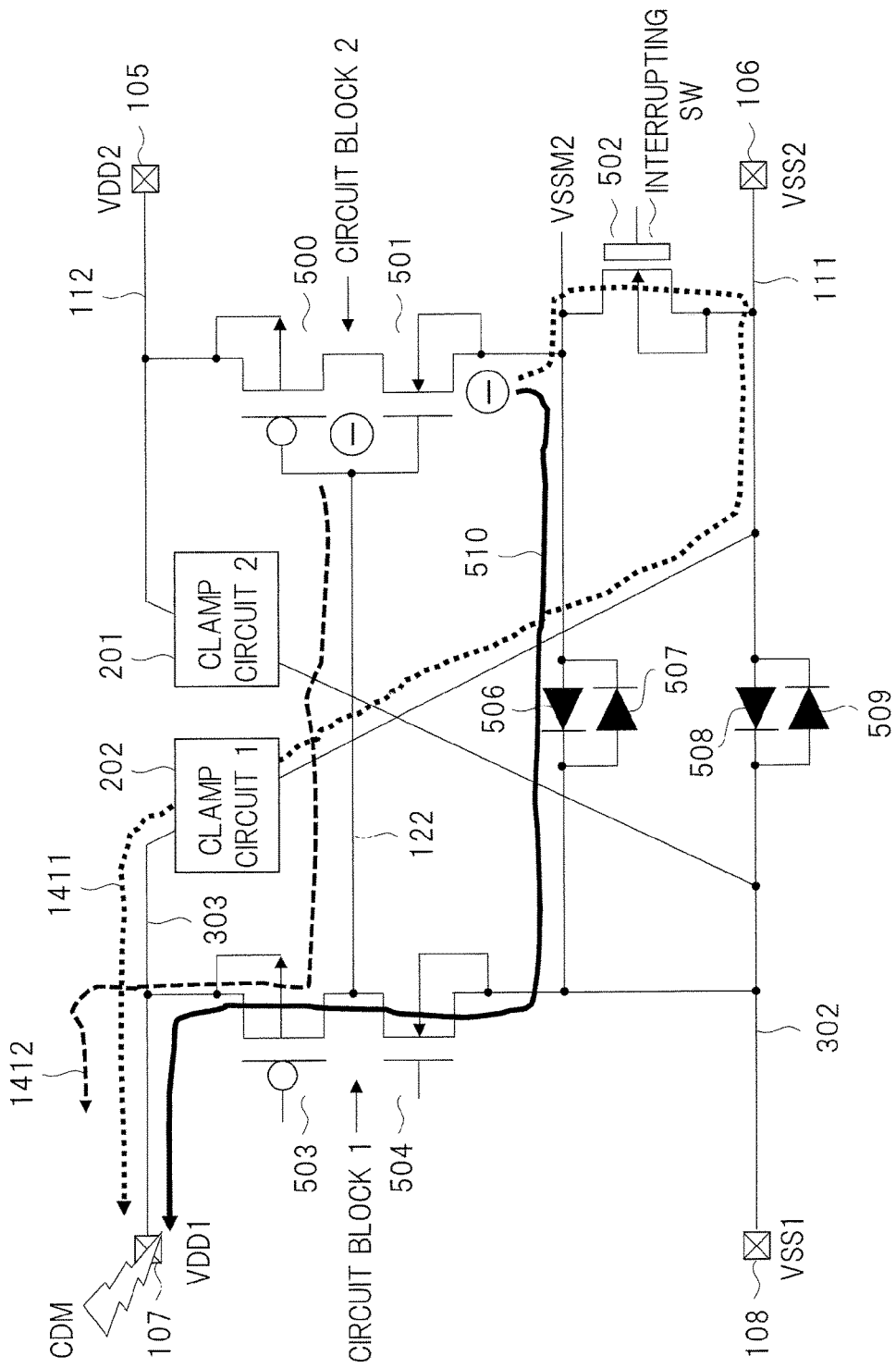

FIG. 12 is a circuit diagram showing a configuration of a semiconductor integrated circuit device in accordance with a fifth embodiment.

Figure 13:
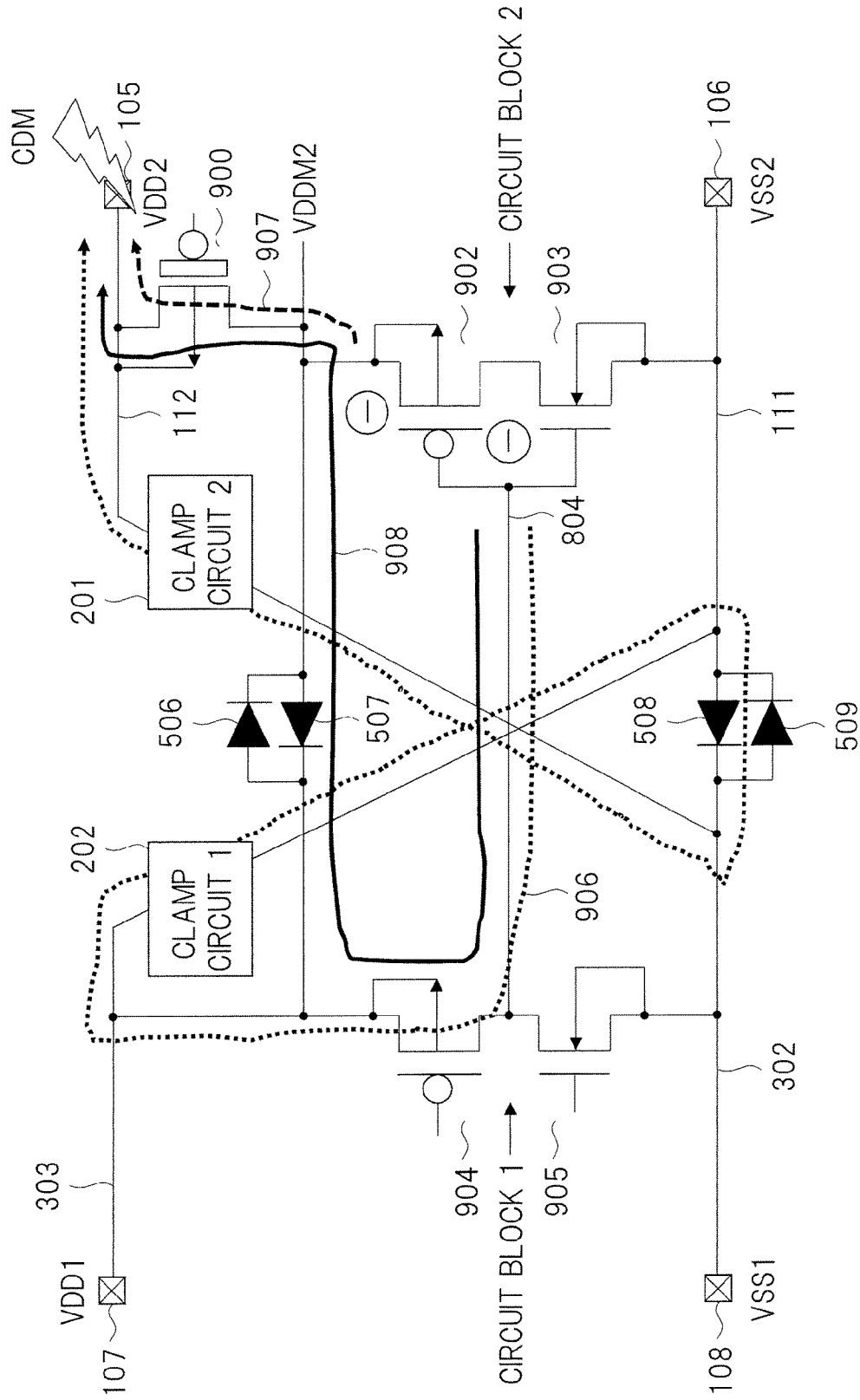

FIG. 13 is a circuit diagram showing a configuration of a semiconductor integrated circuit device in accordance with a sixth embodiment.

Figure 14:
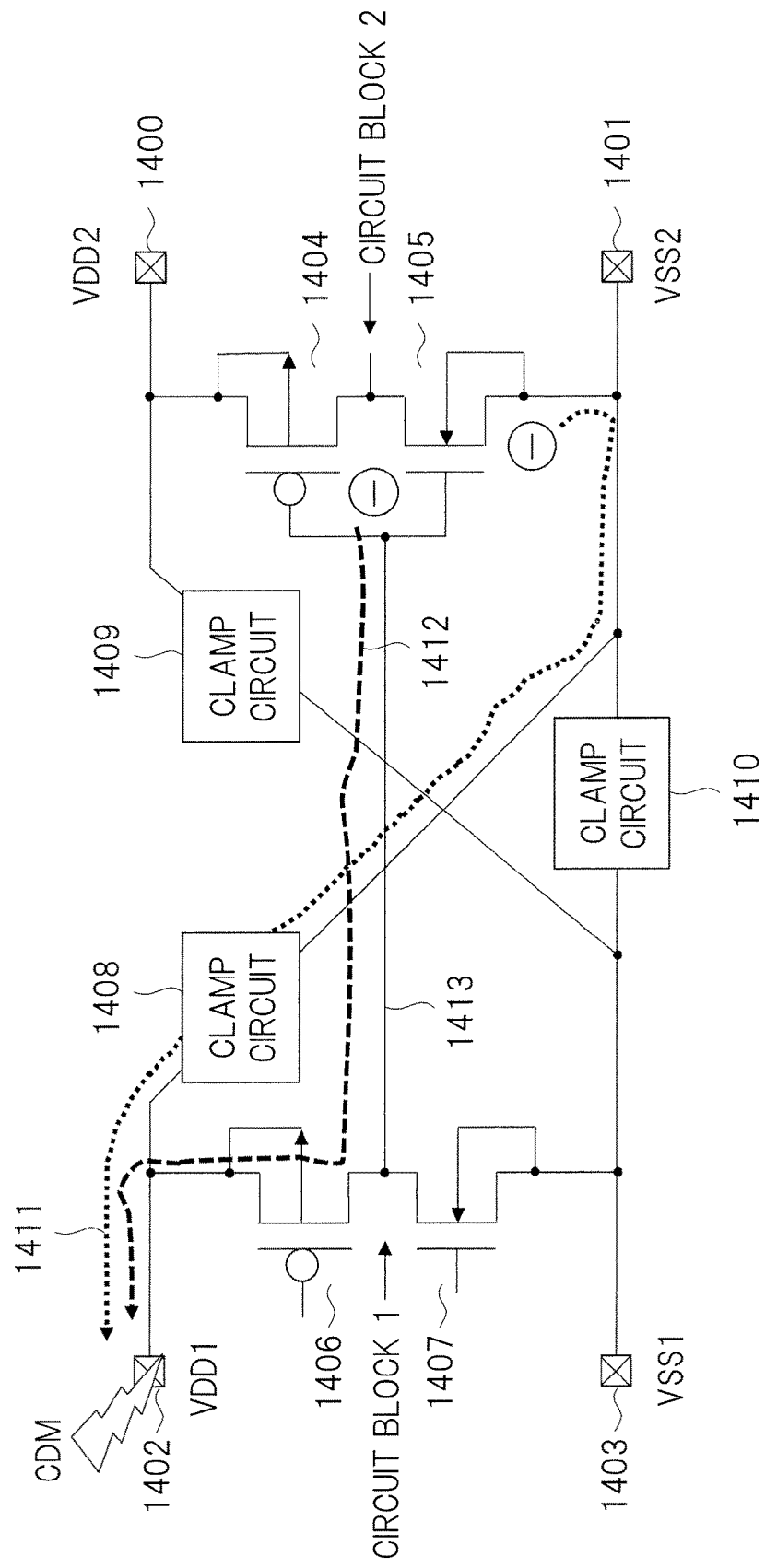

FIG. 14 is an explanatory view that explains examinations carried out by the inventors.

Figure 15:
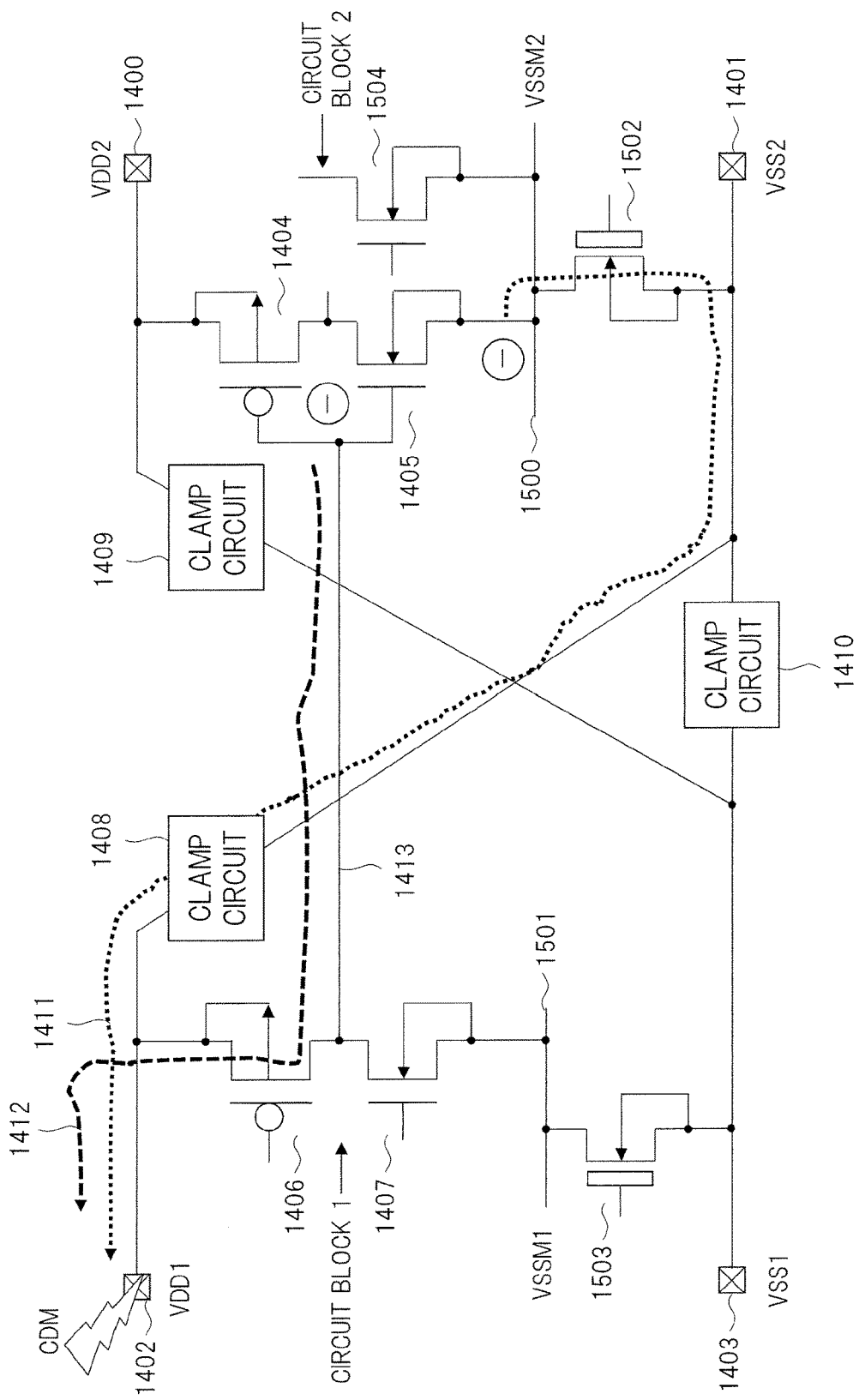

FIG. 15 is an explanatory view that explains examinations carried out by the inventors.

DETAILED DESCRIPTION OF PREFERRED EMBODIMENTS

As below, embodiments of the invention will be explained in detail with reference to the drawings. Note that, in all drawings for explanation of the embodiments, the same members basically have the same signs and their repetitive explanation will be omitted.

First Embodiment

Semiconductor Integrated Circuit Device

Figure 1:
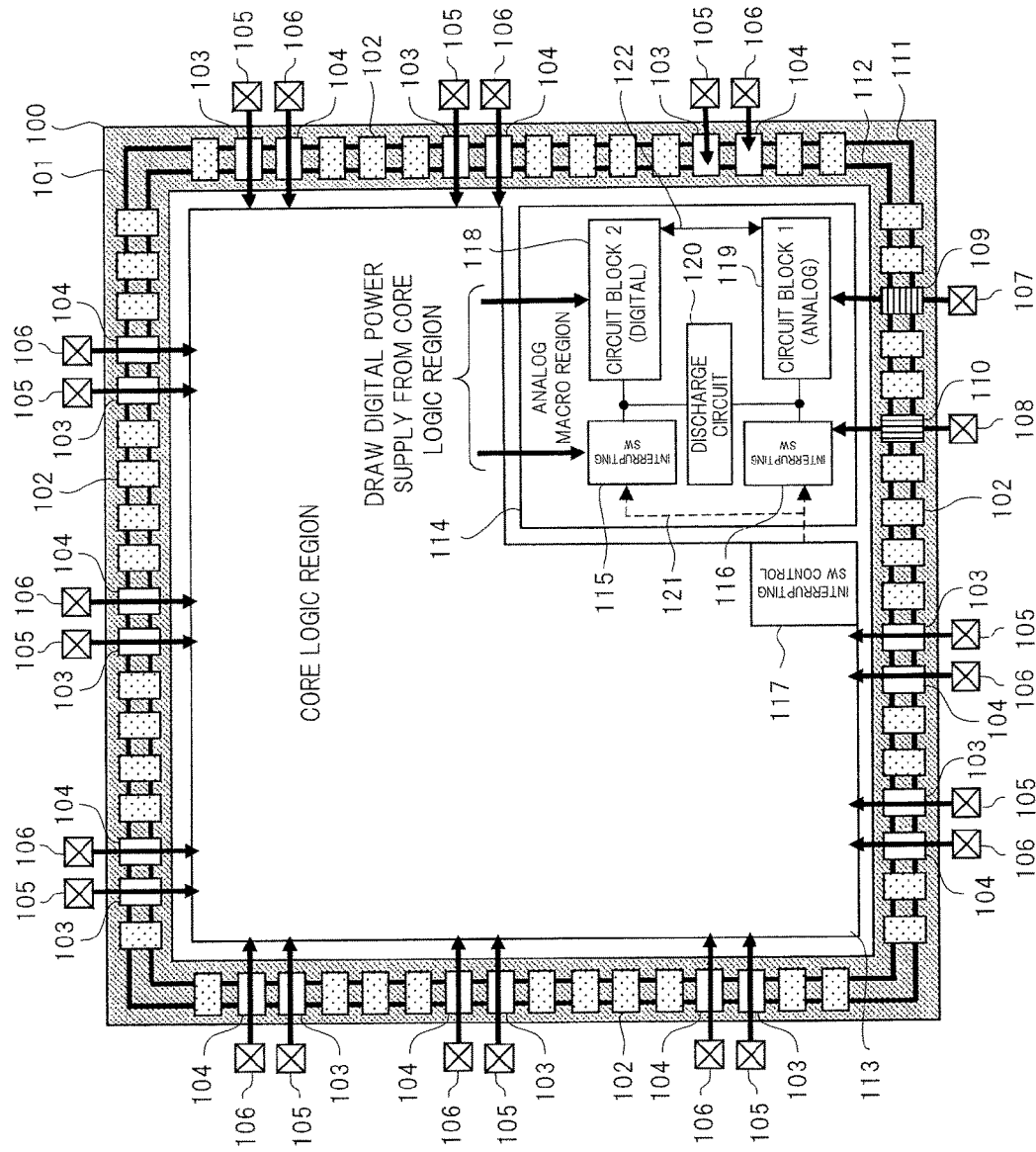
FIG. 1 is a schematic view showing the entire layout of a semiconductor integrated circuit device in accordance with a first embodiment.

FIG. 1 is a schematic view showing a layout of a semiconductor integrated circuit device in accordance with an embodiment. In FIG. 1, reference numeral 100 indicates a semiconductor chip to be built in the semiconductor integrated circuit device, and reference numerals 105 to 108 respectively indicate terminals (pins) provided in the semiconductor integrated circuit device. The terminal 105 is a terminal that supplies a power-supply voltage (first voltage) VDD2 to a plurality of digital circuits formed in the semiconductor chip 100, and the terminal 106 is a terminal that supplies a ground voltage (third voltage) VSS2 to the plurality of digital circuits. Although not particularly limited, in the present embodiment, the plurality of terminals 105 and 106 are provided in the semiconductor integrated circuit device.

The terminal 107 is a terminal that supplies a power-supply voltage (second voltage) VDD1 to analog circuits formed in the semiconductor chip 100, and the terminal 108 is a terminal that supplies a ground voltage (fourth voltage) to the analog circuits. In the present embodiment, the digital circuits and the analog circuits are formed in the semiconductor chip. The terminal for supplying the power-supply voltage and the ground voltage to the analog circuits is physically separated from the terminal (power-supply terminal) for supplying the voltages to the digital circuits, so that power-supply voltages having appropriate voltage values can be respectively supplied to the digital circuits and the analog circuits. Moreover, the separated terminals make it possible to prevent noises from being mutually transmitted.

In FIG. 1, reference numeral 101 indicates a region (hereinafter, referred to as "peripheral I/O region") of a peripheral input/output circuit (hereinafter, referred to as "peripheral I/O") formed in the semiconductor chip 100, and reference numeral 113 indicates a core logic region in which a logic (a plurality of digital circuits) serving as the core of the semiconductor integrated circuit device is formed. Moreover, in the figure, reference numeral 114 indicates an analog macro region in which a plurality of analog circuits and a plurality of digital circuits are formed as macro-chip devices. In the figure, although most of the portions are omitted except for one portion so as to avoid complexity of the drawing, the core logic region 113 and the analog macro region 114 are connected to each other by a plurality of signal wirings so as to allow signals to be mutually transmitted.

In the peripheral I/O region 101, a ring-shaped ground voltage wiring 111 for use in supplying the ground voltage VSS2 to the digital circuits (digital circuits in the core logic region 113 and the analog macro region 114) and a ring-shaped power-supply voltage wiring 112 for use in supplying the power-supply voltage VDD2 to the above-mentioned digital circuits are installed. To the ground voltage wiring 111 and the power-supply voltage wiring 112, a plurality of power-supply voltage cells 103, a plurality of ground voltage cells 104 and a plurality of peripheral I/O cells 102 are connected. The plurality of power-supply voltage cells 103 are respectively connected to the power-supply terminal 105, so that the power-supply voltage VDD2 supplied to the power-supply terminal 105 is supplied to the core logic region 113 and the analog macro region 114 as the power-supply voltage of the digital circuits. Moreover, it is also supplied to the power-supply wiring 112 formed into the ring shape.

In the same manner, the plurality of ground voltage cells 104 are respectively connected to the ground voltage terminal 106, so that the ground voltage VSS2 is supplied to the core logic region 113 and the analog macro region 114 as the ground voltage of the digital circuits. The digital circuits are respectively operated based upon a potential difference (voltage difference) between the supplied power-supply voltage VDD2 and ground voltage VSS2. In other words, the respective digital circuits are operated by the potential difference as their power supply.

The plurality of peripheral I/O cells 102 are installed between signal-use terminals (signal terminals: not shown in the figure) provided in the semiconductor integrated circuit device and circuits (digital circuits and analog circuits) formed in the semiconductor chip. The peripheral I/O cells 102 receive the power-supply voltage VDD and the ground voltage VSS2 from the power-supply voltage wiring 112 and the ground voltage wiring 111, and carry out receiving and transmitting operations (inputting and/or outputting operations) of signals between the signal terminals and the circuits. Additionally, in order to avoid complexity of the drawing, in FIG. 1, except for some blocks, the peripheral I/O cells 102 are indicated only as blocks occupied by dots without any symbols added thereto.

In the present embodiment, the analog macro region 114 is provided with a circuit block 118 (hereinafter, referred to also as circuit block 2) including a plurality of digital circuits, and a circuit block 119 (hereinafter, referred to also as circuit block 1) including a plurality of analog circuits. Moreover, the analog macro region 114 is provided with a power-supply interrupting switch circuit 115 (indicated as interrupting SW in the figure), a power-supply interrupting switch circuit 116 (indicated by interrupting SW in the figure) and a discharge circuit 120.

The circuit block 118 is connected to the power-supply interrupting switch circuit 115 by an interrupting power-supply wiring. Although not particularly limited in the present embodiment, the power-supply voltage VDD2 is supplied to the circuit block 2 from the core logic region 113 and/or the peripheral I/O region 101, while the ground voltage VSS2 is supplied to the power-supply interrupting switch circuit 115 from the core logic region 113 and/or the peripheral I/O region 101. On the other hand, an analog circuit-use power-supply voltage is supplied to the circuit block 1 from the terminal 107 of the power-supply voltage, through a power-supply voltage cell 109. Moreover, the circuit block 1 is connected to the power-supply interrupting switch circuit 116 through the interrupting power-supply wiring. An analog circuit-use ground voltage is supplied to the power-supply interrupting switch circuit 116 from the terminal 108 of the ground voltage, through the ground voltage cells 110. The discharge circuit 120 for use in discharging charge is connected to the interrupting power-supply wiring, the detailed description of which will be given layer by using FIG. 3 or the like.

The power-supply interrupting switch circuits 115 and 116 are on/off controlled by an interrupting switch control circuit (interrupting SW control in the FIG. 117 provided in the core logic region 113. That is, by a control signal 121 (indicated by a broken line) from the interrupting switch control circuit 117, the power-supply interrupting switch circuits 115 and 116 are respectively switch-controlled. In each of the digital circuits inside the circuit block 118, when the digital circuit is operated, the power-supply interrupting switch circuit 115 is brought into an on-state by the control signal 121, and a differential voltage between the power-supply voltage VDD2 and the ground voltage VSS2 is applied thereto so as to be operated. In the same manner, in each of the analog circuits included in the circuit block 119, when the analog circuit is operated, the power-supply interrupting switch circuit 116 is brought into an on-state by the control signal 121, and a differential voltage between the power-supply voltage VDD1 and the ground voltage VSS1 is applied thereto so as to be operated.

The digital circuit inside the circuit block 118 and the analog circuit inside the circuit block 119 are connected to each other by a signal wiring 122. When the digital circuit and the analog circuit are operated, signals are received and transmitted between the digital circuit and the analog circuit through the signal wiring 122. The circuit block 118 and the circuit block 119 are operated by power-supply voltages having mutually different voltage values. Therefore, the signals received and transmitted through the signal wiring 122 form different power-supply bridging signals.

The power-supply voltage cell 109 is connected to a terminal (pin) 107 to which the analog circuit-use power-supply voltage VDD1 is supplied, so that the power-supply voltage VDD1 is supplied to the circuit block 119. In the same manner, the ground voltage cell 109 is connected to a terminal (pin) 108 to which the analog circuit-use ground voltage VSS1 is supplied, so that the ground voltage VSS1 is supplied to the power-supply interrupting switch circuit 116. Additionally, each of the power-supply voltage cell 109 and ground voltage cell 110 is neither connected to the ring-shaped voltage wiring 112 nor connected to the ring-shaped ground voltage wiring 111. Moreover, although not shown in the figure, a protective circuit for protecting a circuit from static electricity is provided in each of the power-supply voltage cell 109 and ground voltage cell 110.

In the CDM test, the semiconductor integrated circuit device including the semiconductor chip 100 is electrified. After having been electrified, a terminal for use in the test is selected from the plurality of terminals (pins) installed therein, and by contacting the metal terminal with the selected terminal, the ground potential is applied to the selected terminal. In the example of the semiconductor integrated circuit device shown in FIG. 1, after having been electrified, the terminal for use in the test is selected from, for example, the terminals (pins) 105 to 108, and the metal terminal is made in contact therewith.

Figure 2:
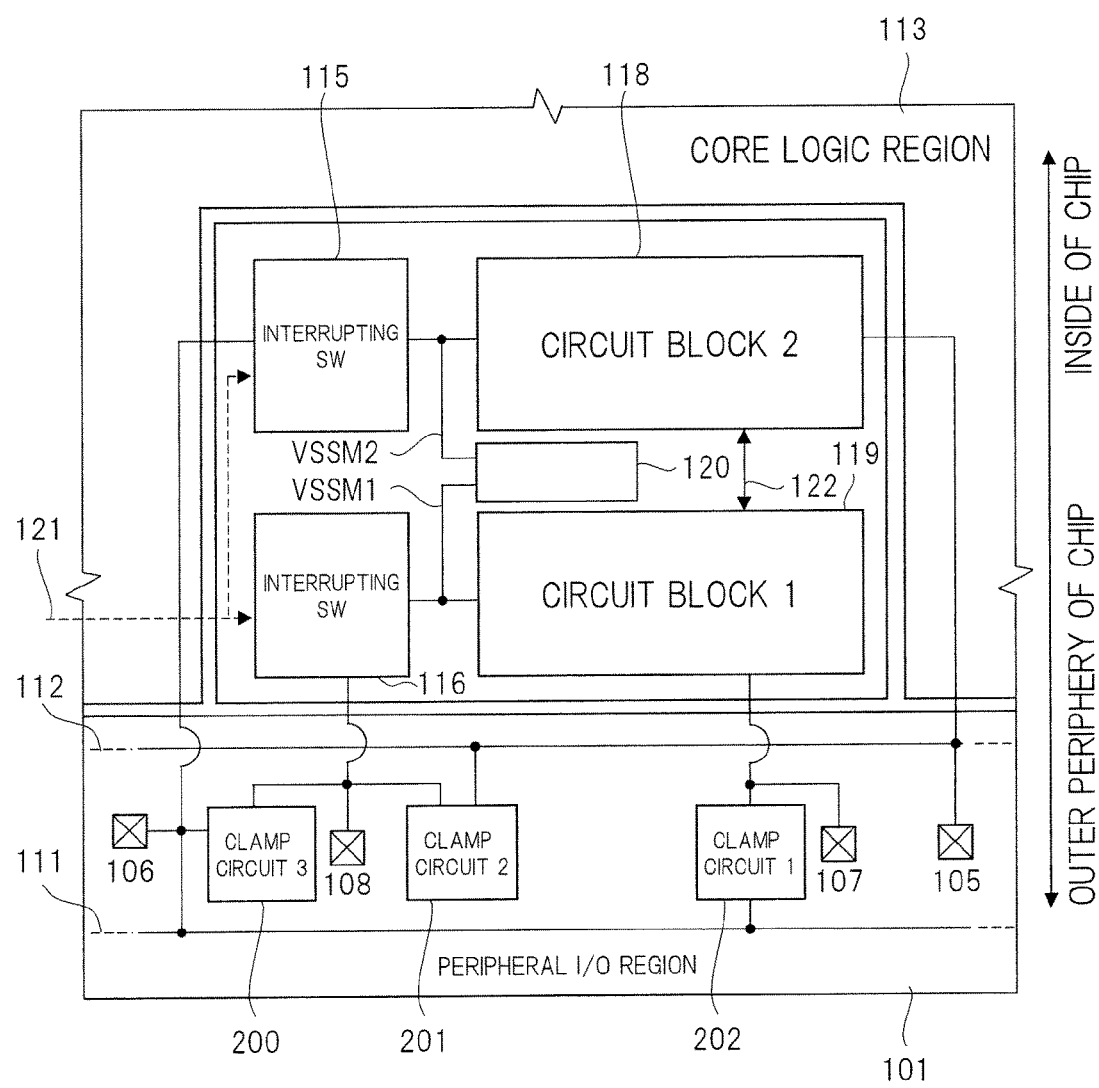
FIG. 2 is a schematic view showing the layout of an essential portion of the semiconductor integrated circuit device in accordance with the first embodiment.

Next, referring to FIG. 2, the following description will discuss the analog macro region 114 and its peripheral portion. The figure illustrates the analog macro region 114 and a peripheral I/O region having a protective circuit relating to the analog macro region 114. In the figure, the upper side shows the inside of the semiconductor chip, and the lower side shows the outer periphery side of the semiconductor chip. Moreover, in the figure, those portions that are the same as those of FIG. 1 are indicated by the same reference numerals.

In the figure, the VSSM2 indicates an interrupting power-supply wiring that connects the power-supply interrupting switch circuit 115 and the circuit block 118 to each other, and the VSSM1 indicates an interrupting power-supply wiring that connects the power-supply interrupting switch 116 and the circuit block 119 to each other. When the power-supply interrupting switch circuit 115 is turned on by the control signal 121, the interrupting power-supply wiring VSSM2 provides a voltage in accordance with the ground voltage VSS2. In the same manner, when the power-supply interrupting switch circuit 116 is turned on by the control signal 121, the interrupting power-supply wiring VSSM1 provides a voltage in accordance with the ground voltage VSS1.

The above-mentioned discharge circuit 120 is provided in the analog macro region 114, and connected to between the interrupting power-supply wirings VSSM1 and VSSM2. The discharge circuit 120 is preferably installed near a circuit for forming the different power-supply bridging signal and a circuit for receiving the different power-supply bridging signal. Moreover, upon connection with the interrupting power-supply wiring, it is desirable to reduce the parasitic resistance. In the present embodiment, the circuit block 1 for forming the different power-supply bridging signal, the circuit block 2 for receiving the different power-supply bridging signal, the interrupting power-supply wirings VSSM1 and VSSM2, and the discharge circuit 120 are installed in the analog macro region 114, with these components being located close to one another. With this arrangement, the interrupting power-supply wiring and the discharge circuit 120 can be connected to each other at about 1 to 2Ω of the parasitic resistance. Moreover, by also providing the power-supply interrupting switch circuits 115 and 116 in the analog macro region 114, losses caused by the power-supply interrupting switch circuits can be reduced.

In FIG. 2, in order to easily understand a relation of the terminals (pins), the power-supply voltage terminals 105 and 107, as well as the ground voltage terminals 106 and 108, are indicated in the peripheral I/O region 101. As described earlier, the digital circuit-use power supply voltage VDD2 and ground voltage VSS2 are supplied to the power-supply voltage terminal 105 and the ground voltage terminal 106, and the analog circuit-use power supply voltage VDD1 and ground voltage VSS1 are supplied to the power-supply voltage terminal 107 and the ground voltage terminal 108. FIG. 2 indicates protective circuits included in the power-supply voltage cell 109 and the ground voltage cell 110. That is, in the power-supply voltage cell 109, a clamp circuit 202 (hereinafter, referred to also as clamp circuit 1) connected to between the ground wiring 111 and the power-supply voltage terminal 107 is included, and in the ground voltage cell 110, a clamp circuit 201 (hereinafter, referred to also as clamp circuit 2) connected to between the ground wiring 112 and the ground voltage terminal 108 is included. Although omitted from FIG. 1, a clamp circuit 200 (hereinafter, referred to also as clamp circuit 3) is connected to between the analog circuit-use ground voltage wiring (a ground wiring connected to the ground voltage terminal 108) and the digital circuit-use ground voltage wiring 111. With respect to the configurations of the clamp circuits 200, 201 and 202, the description thereof will be omitted in this case because explanations thereof will be given later with reference to FIGS. 5 to 7. These clamp circuits 200, 201 and 202 correspond to clamp circuits 13a, 13b and 13c illustrated in FIG. 1 of Patent Document 1.

<Circuit Blocks 1 and 2, Power-Supply Interrupting Switch Circuit and Interrupting Power-Supply Wring>

Figure 3:
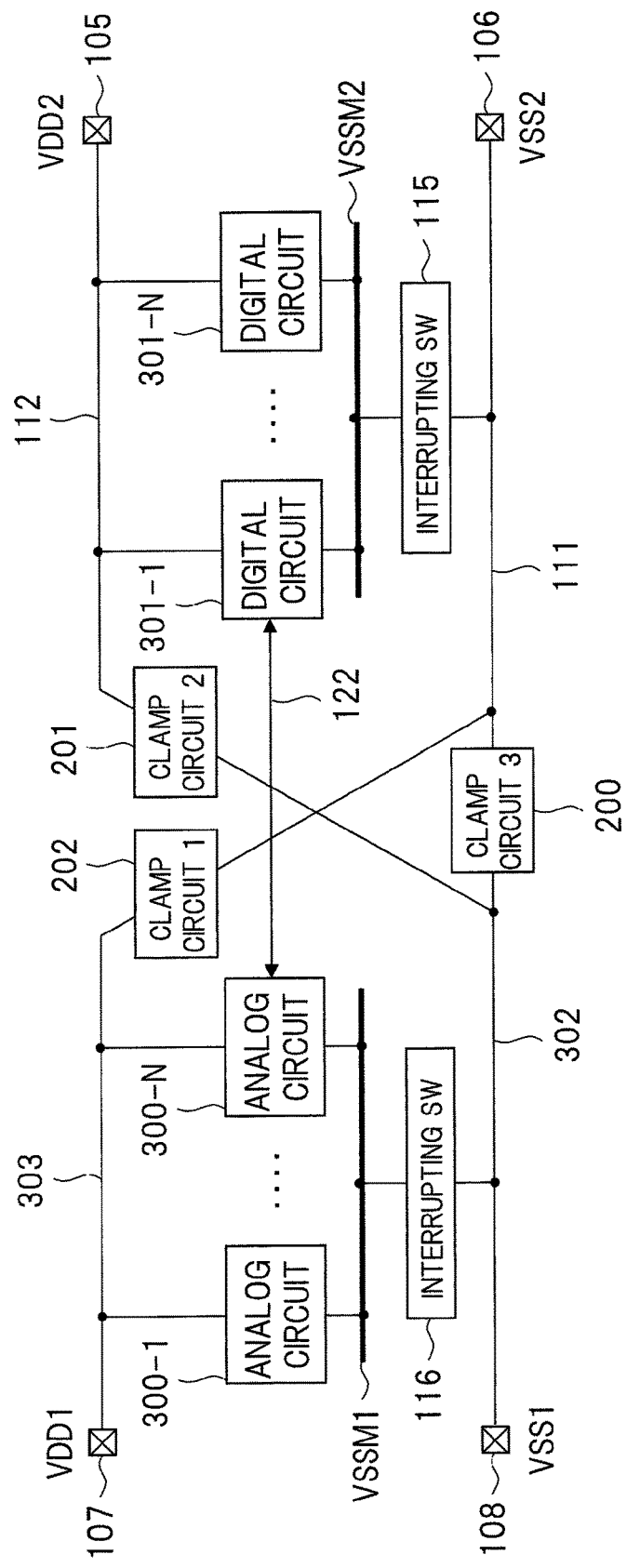
FIG. 3 is a block diagram showing a configuration of the semiconductor integrated circuit device in accordance with the first embodiment.

Next, the following description will discuss the circuit blocks, the power-supply interrupting switch circuit and the interrupting power-supply wiring. FIG. 3 is a block diagram showing a configuration of circuit blocks included in the semiconductor integrated circuit device. FIG. 3 illustrates the circuit blocks 118, 119 and the power-supply interrupting switch circuits 115, 116 included in the analog macro region 114.

In FIG. 3, reference numerals 300-1 to 300-N respectively indicate analog circuits, which are included in the circuit block 119 shown in FIG. 1 and FIG. 2. Moreover, reference numerals 301-1 to 301-N respectively indicate digital circuits, which are included in the circuit block 118 shown in FIG. 1 and FIG. 2. The analog circuits 300-1 to 300-N are operated by a power-supply voltage having a value different from that of the digital circuits 301-1 to 301-N.

The digital circuits 301-1 to 301-N are respectively connected in parallel with one another between the power-supply voltage wiring 112 and the interrupting power-supply wiring VSSM2, and the power-supply interrupting switch circuit 115 is connected to between the interrupting power-supply wiring VSSM2 and the ground voltage wiring 111. The power-supply interrupting switch circuit 115 is on/off controlled by the control signal 121, although not shown in the figure. When the power-supply interrupting switch circuit 115 is turned on, the potential of the interrupting power-supply wiring VSSM2 provides a value in accordance with the voltage VSS2 in the ground voltage wiring 111. Thus, a differential voltage between the voltage in the power-supply voltage wiring 112 and the voltage in the digital-use interrupting power-supply wiring VSSM2 is supplied to each of the digital circuits 301-1 to 301-N so as to be operated.

The analog circuits 300-1 to 300-N are respectively connected in parallel with one another between an analog-use power supply wiring 303 connected to the terminal 107 for use in receiving the analog-use power-supply voltage VDD1 and the interrupting power-supply wiring VSSM1, and the interrupting power-supply wiring VSSM1 is connected to an analog-use ground wiring 302 through the power-supply interrupting switch 116. The analog-use ground wiring 302 is connected to the terminal 108 that receives the analog-use ground voltage VSS1. Thus, when the power-supply interrupting switch circuit 116 is turned on by the control signal 121, the potential of the analog-use interrupting power-supply wiring VSSM1 provides a value in accordance with the ground voltage VSS1. Therefore, a differential voltage between the voltage in the power-supply voltage wiring 303 and the potential in the interrupting power-supply wiring VSSM1 is supplied to each of the analog circuits 300-1 to 300-N so as to be operated. The clamp circuit 201 (202) is connected to between the power-supply voltage wiring 112 (303) and the ground voltage wiring 302 (111), and the clamp circuit 200 is connected to between the ground voltage wirings 111 and 302.

In this manner, each of the interrupting power-supply wirings VSSM2 and VSSM1 has its physical length set to be comparatively long so as to commonly connect the plurality of circuits (analog circuits 300-1 to 300-N and digital circuits 301-1 to 301-N). Moreover, in order to stabilize the potential of the interrupting power-supply wirings (VSSM2, VSSM1) when a current is supplied respectively to/or supplied respectively from the plurality of circuits, the physical width is also set to be comparatively large. In the figure, in order to clarify this fact, the interrupting power-supply wiring is drawn by a thick line. Moreover, elements that respectively constitute the power-supply interrupting switch circuits 115 and 116 are also set to be comparatively large. For this reason, parasitic capacitances respectively possessed by the interrupting power-supply wirings VSSM2 and VSSM1 become comparatively large.

As shown in FIG. 3, by providing the power-supply interrupting switch circuits 115 and 116, a power-supply interrupting operation is carried out, and thus makes it possible to reduce the power consumption. Moreover, by providing a power-supply interrupting switch circuit commonly in the plurality of circuits, it becomes possible to suppress a large-size of the semiconductor chip.

<Clamp Circuit, Discharge Circuit>

Figure 4:
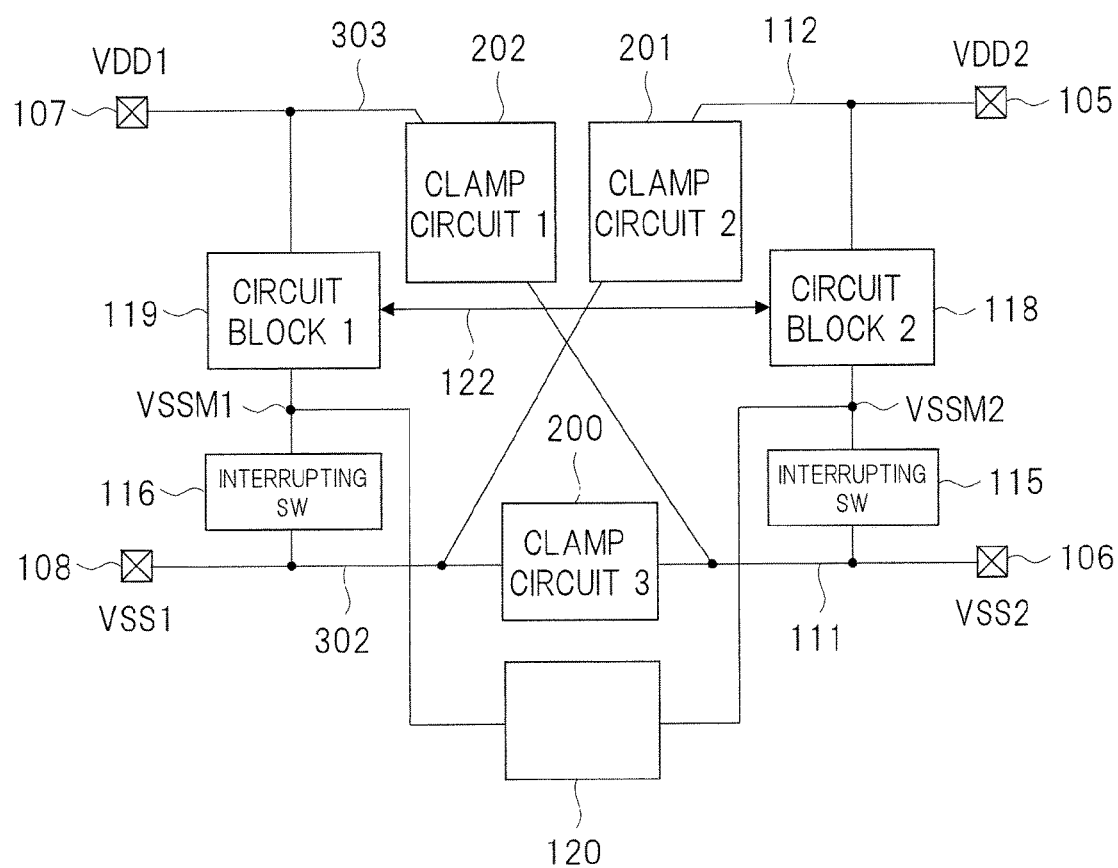
FIG. 4 is a block diagram showing a configuration of the semiconductor integrated circuit device in accordance with the first embodiment.

FIG. 4 is a block diagram showing a configuration of a semiconductor integrated circuit device in accordance with this embodiment. In the above-mentioned FIG. 3, a discharge circuit 120 is provided between the interrupting power-supply wiring VSSM1 and the interrupting power-supply wiring VSSM2. Additionally, in FIG. 4, the analog circuits 300-1 to 300-N shown in FIG. 3 are indicated as one circuit block 119, and the digital circuits 301-1 to 301-N are indicated as one circuit block 118. In FIG. 4, the power-supply interrupting switch circuits 115 and 116 may be respectively configured by, for example, MOSFETs. Further, the digital circuit and the analog circuit inside the circuit block 118 and the circuit block 119 are configured by MOSFETs.

Figure 5:
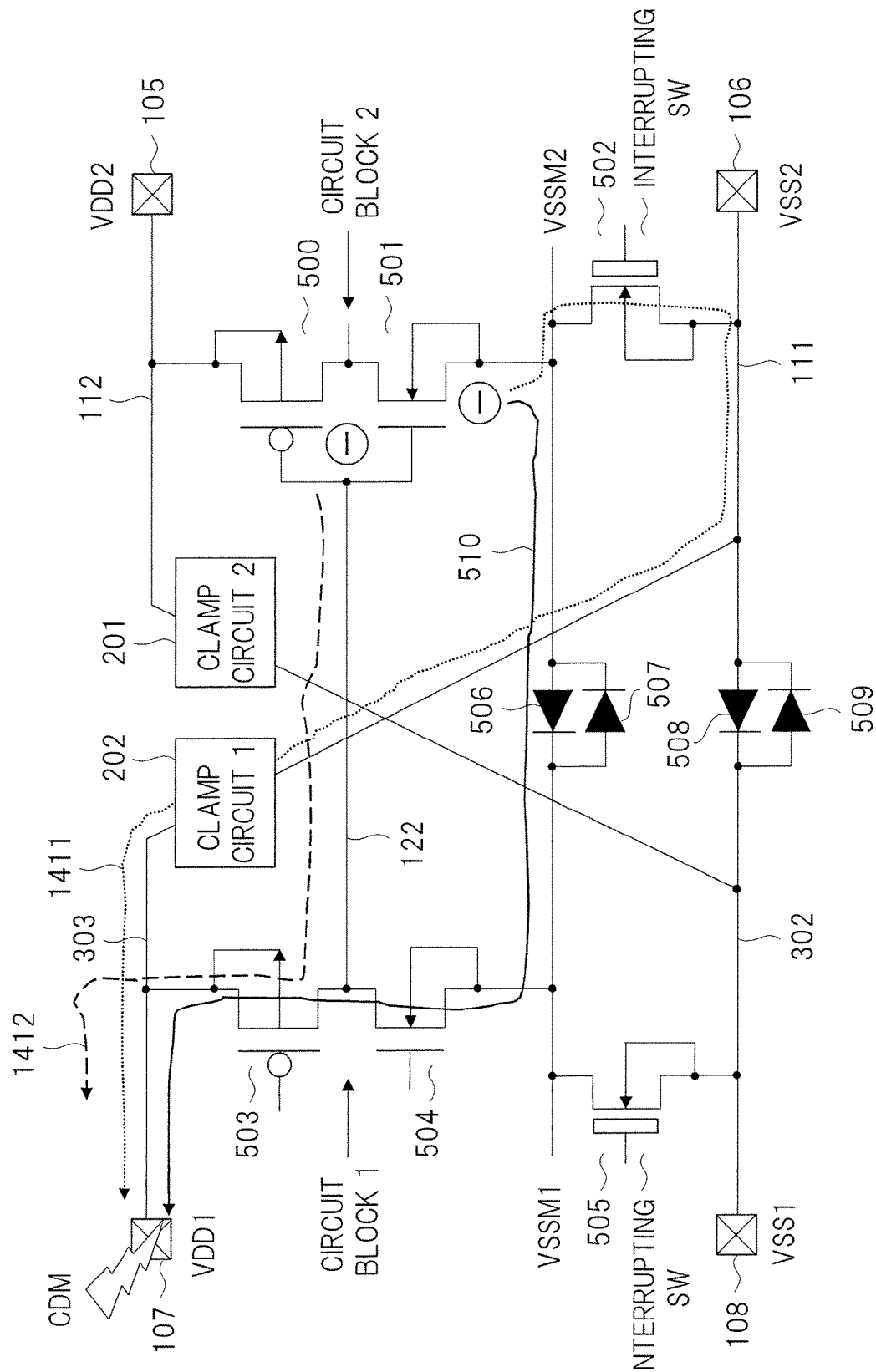
FIG. 5 is a circuit diagram showing a configuration of the semiconductor integrated circuit device in accordance with the first embodiment.

FIG. 5 is a circuit diagram showing a configuration in the case when in FIG. 4, the power-supply interrupting switch circuit is configured by an MOSFET, and the clamp circuit 200 and the discharge circuit 120 are respectively configured by diode elements. Next, referring to FIG. 5, the configuration and operations of the semiconductor integrated circuit device are explained.

In FIG. 5, reference numeral 500 indicates a P-FET, and 501 indicates an N-FET. The source and back gate of the P-FET 500 are connected to the power-supply wiring 112, and the source (one of the electrodes) and back gate of the N-FET 501 are connected to the interrupting power-supply wiring VSSM2. Moreover, the respective drains (the other electrode) of the P-FET 500 and N-FET 501 are commonly connected to each other, and the respective gates of the P-FET 500 and N-FET 501 are also commonly connected to each other. Thus, an inverter circuit is configured by the P-FET 500 and N-FET 501. The input of the inverter circuit, that is, the gates of the P-FET 500 and N-FET 501 are connected to the signal wiring 122. This inverter circuit is one circuit example among the plurality of digital circuits included in the above-mentioned circuit block 2.

The interrupting power-supply wiring VSSM2 is connected to the ground voltage wiring 111 through the N-FET 502. That is, the source and back gate of the N-FET 502 are connected to the ground voltage wiring 111, and the drain thereof is connected to the interrupting power-supply wiring VSSM2. The N-FET 502, which receives a control signal 121 from the power-supply interrupting switch control circuit 117 (FIG. 1) through its gate, constitutes the power-supply interrupting switch circuit 115 shown in FIG. 4. That is, in accordance with the control signal 121, the N-FET 502 is selectively set to an on-state to supply the ground voltage VSS2 to the interrupting power-supply wiring VSSM2.

In FIG. 5, the reference numeral 503 indicates a P-FET, and 504 indicates an N-FET. The source and back gate of the P-FET 503 are connected to the analog-use power-supply voltage wiring 303, and the source (one of the electrodes) and back gate of the N-FET 504 are connected to the interrupting power-supply wiring VSSM1. The drain of the P-FET 503 and the drain (the other electrode) of the N-FET 504 are commonly connected to each other. Moreover, the respective drains of the P-FET 503 and N-FET 504 are connected to the signal wiring 122. Signals are supplied to the respective gates of the P-FET 503 and the N-FET 504 from a circuit (analog circuit) located on the preceding stage (not shown). Although not particularly limited, the signals from mutually different analog circuits are supplied to the gate of the P-FET 503 and the gate of the N-FET 504. In this case, for example, an output signal from an analog circuit such as a differential amplification circuit supplied to the gate of the N-FET 504, and the gate of the P-FET 503 is connected to a current mirror circuit. The P-FET 503 and the N-FET 504 correspond to circuits that constitute an output stage of an analog circuit, which is one circuit example of the plurality of analog circuits included in the circuit block 119.

The output of the analog circuit is supplied to the digital circuit through the signal wiring 122. That is, through the signal wiring 122, the output signal is supplied to the gates of the N-FET 501 and the P-FET 500.

In FIG. 5, reference numeral 505 indicates an N-FET, which constitutes a power-supply interrupting switch circuit in the same manner as in the N-FET 502. That is, the source and back gate of the N-FET 505 are connected to the analog-use ground voltage wiring 302, and the drain thereof is connected to the interrupting power-supply wiring VSSM1. Although omitted from the figure, the above-mentioned control signal 121 is supplied to the gate of the N-FET 505. Thus, the N-FET 505 is selectively set to an on-state. When the N-FET 505 is set to the on-state, the analog-use ground voltage VSS1 is supplied to the interrupting power-supply wiring VSSM2.

A pair of diode elements 508 and 509 is connected to between the analog-use ground voltage wiring 302 and the digital-use ground voltage wiring 111. The anode of the diode element 508 is connected to the cathode of the diode element 509, and the cathode of the diode element 508 is connected to the anode of the diode element 509. By making the connection in this manner, a forward direction current is made to flow in both directions. The above-mentioned clamp circuit 200 is configured by this pair of diode elements. The configuration is made so as to make the forward direction current flow in both directions; therefore, even in the case when a potential difference more than that required for conducting the diodes occurs between the ground potential wiring 111 and the ground potential wiring 302, a current flows through the clamp circuit 200, with the result that the potential difference between these two ground potential wirings is clamped. Since the current flows through the clamp circuit 200 so as to clamp the potential difference, it may be regarded as a discharge circuit for discharging a charge.

In FIG. 5, reference numerals 506 and 507 indicate diode elements. This pair of diode elements 506 and 507 is also designed to have the same configuration as that of the diode elements 508 and 509. That is, the anode of the diode element 506 is connected to the cathode of the diode element 507, and the cathode of the diode element 506 is connected to the anode of the diode element 507. Moreover, the anode of the diode element 506 is connected to the interrupting power-supply wiring VSSM2, and the cathode of the diode element 506 is connected to the interrupting power-supply wiring VSSM1. The discharge circuit 120 shown in FIG. 4 is configured by this pair of diode elements 506 and 507. In the case when a potential difference more than that required for conducting the diode elements occurs between the interrupting power-supply wiring VSSM1 and the interrupting power-supply wiring VSSM2, a current flows to discharge a charge, with the result that the potential difference is lowered.

FIG. 5 shows discharge paths in the case when, for example, the terminal 107 is set to the ground voltage, after the semiconductor integrated circuit device has been electrified, by using broken lines 1411 and 1412 with arrows and a solid line 506 with an arrow.

First, as understood by the explanation using FIG. 15, charges are accumulated in the gates of the P-FET 500 and the N-FET 501 and the signal wiring 122 by electrification. Moreover, a charge is accumulated in the parasitic capacitance that is parasitic on the interrupting power-supply wiring VSSM2 by electrification. As has been explained with reference to FIG. 3 and FIG. 15, the parasitic capacitance that is parasitic on the interrupting power-supply wiring VSSM2 includes a parasitic capacitance of the interrupting power-supply wiring VSSM2, a parasitic capacitance of an element (source of an MOSFET) connected to the interrupting power-supply wiring VSSM2, and a parasitic capacitance of the power-supply interrupting switch circuit (for example, the drain of the N-FET 502), which form a comparatively large capacitance value. For this reason, as explained in FIG. 15, in comparison with a rate in which the potential of the signal wiring 122 connected to the gate of the N-FET 501 changes, the rate of change in potential in the source of the N-FET 501 becomes slower, so that a large potential difference is applied to between the gate and the source of the N-FET 501.

In contrast, in the present embodiment, the discharge circuit 120 is connected to between the interrupting power-supply wirings VSSM1 and VSSM2. For this reason, when a potential difference occurs between the interrupting power-supply wiring VSSM2 and the interrupting power-supply wiring VSSM1, a current is made to flow by the discharge circuit 120 to discharge the charge, so that the potential of the interrupting power-supply wiring VSSM2 is changed. Thus, the delay of discharge of the charge accumulated in the source (interrupting power-supply wiring VSSM2) of the N-FET 501 relative to the discharge of the charge accumulated in the gate of the N-FET 501 through the signal wiring 122 can be shortened, thereby making it possible to prevent the electric potential between the gate and the source of the N-FET 501 from becoming larger. The discharge path by the discharge circuit 120 is indicated as a solid line 510 with an arrow.

Moreover, in the present embodiment, the charge accumulated in the source of the N-FET 501 is discharged by a path indicated by a broken line 1411 with an arrow through the N-FET 502 and the clamp circuit 202 constituting the power-supply interrupting switch circuit 115. Thus, the delay of change in the source potential of the N-FET 501 relative to the change in the gate potential of the N-FET 501 caused by the discharge through the signal line 122 can be further reduced, thereby making it possible to further reduce the gate breakdown of the N-FET 501.

Additionally, the discharge path 1411 indicated by the broken line with an arrow is formed by the N-FET 1502 for use in power-supply interruption and the clamp circuit 202. Moreover, the discharge path 1412 indicated by the broken line with an arrow is formed by the parasitic diode of the P-FET 503. The discharge path 506 formed by providing the discharge circuit 120 is formed by parasitic diodes of the discharge circuit 120 and the MOSFETs 503 and 504.

Figure 6:
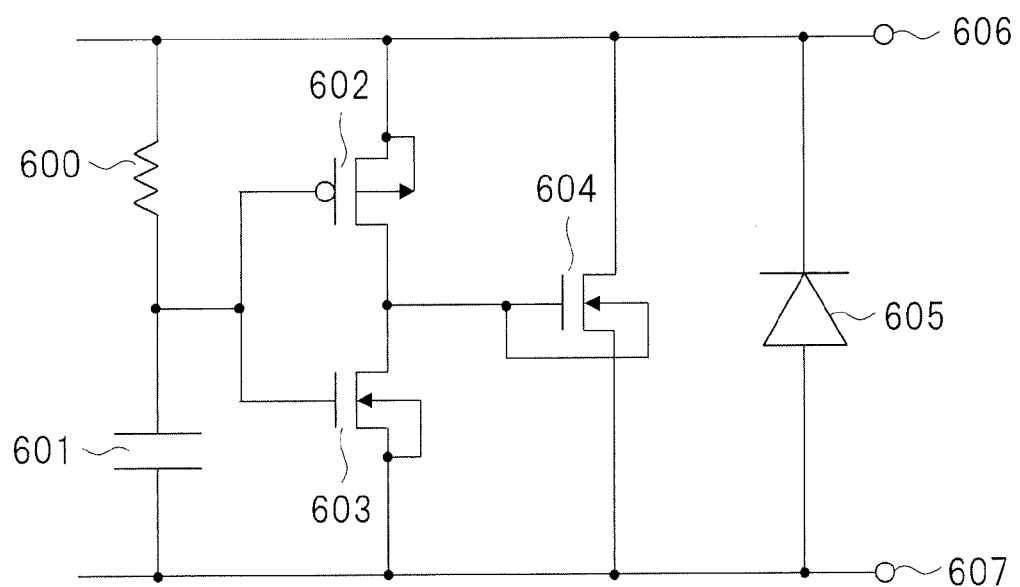
FIG. 6 is a circuit diagram showing a configuration of a clamp circuit.

The following description will discuss configurations of the clamp circuits 201 and 202. FIG. 6 is a circuit diagram showing configurations of the clamp circuits. In FIG. 6, reference numeral 600 indicates a resistive element, 601 indicates a capacitance element, 602 to 604 indicate MOSFETs, and 605 indicates a diode element. Moreover, 606 and 607 indicate terminals of the clamp circuit. The terminal 606 is connected to a high potential side, and the terminal 607 is connected to a low potential side. For example, in the case when in FIG. 5, the voltages VDD2 and VDD1 have higher potentials in comparison with the voltages VSS2 and VSS1, the terminal 606 is connected to the power-supply voltage wiring 112 or 303, and the terminal 607 is connected to the ground voltage wiring 111 or 302.

The resistive element 600 and the capacitance element 601 are connected in series with each other to form a series circuit. This series circuit is connected to between the terminal 606 and the terminal 607. The MOSFET 602 is a P-FET, and the MOSFET 603 is an N-FET. These P-FET 602 and N-FET 603 are connected to allow their source-drain path to be in series so as to form an inverter circuit, and the input of the inverter circuit is connected to a connection point of the resistive element 600 and the capacitance element 601. Moreover, the power supply of the inverter circuit is supplied from the terminals 606 and 607. The FET 604 is an N-FET, and its gate and back gate are connected to the output of the inverter circuit. One of the electrodes (source or drain) of the N-FET 604 is connected to the terminal 606, and the other electrode (drain or source) thereof is connected to the terminal 607. The anode of the diode element 605 is connected to the terminal 607, and the cathode is connected to the terminal 606.

In this clamp circuit, in the case when the potential of the terminal 606 is raised relative to the potential of the terminal 607, the potential of the connection point between the resistive element 600 and the capacitance element 601 is also raised in accordance with a time constant of a series circuit configured by the resistive element 600 and the capacitance element 601. For example, in the case when the rise of the potential of the terminal 606 abruptly occurs, since the rise of the potential at the above-mentioned connection point is delayed, so that the P-FET 602 is set to an on-state, thereby allowing the N-FET 604 to be set to an on-state. Thus, the potential in the terminal 606 is clamped. On the other hand, in the case when the potential of the terminal 607 is raised relative to the potential of the terminal 606, the diode element 605 is set to a bias state in the forward direction, so that the potential of the terminal 607 is clamped. This clamp circuit may be regard as being configured by a timer circuit formed by the resistive element 600, the capacitance element 601 and the inverter circuit, a power clamp circuit configured by the N-FET 604 to be driven by the timer circuit, and the diode element 605.

Next, the following description will explain the configuration of a pair of diode elements used as the discharge circuit 120. FIG. 7(A) is a plan view showing a pair of diode elements formed in the semiconductor chip 100 (FIG. 1). Moreover, FIG. 7(B) is a cross-sectional view showing a cross section A-A' of FIG. 7(A).

In FIG. 7(A) and FIG. 7(B), the pair of diode elements 506 and 507 (FIG. 5) is shown. In FIG. 7(A) and FIG. 7(B), a portion illustrated on the right side corresponds to the diode element 506, and a portion illustrated on the left side corresponds to the diode element 507. Since the diode elements 506 and 507 have mutually the same configuration, only the diode element 506 shown on the right side is explained in its configuration, in FIG. 7(A) and FIG. 7(B).

In FIG. 7(A) and FIG. 7(B), reference numeral 700 indicates a P-type well region formed in the semiconductor chip 100, 704 indicates an N-type well region formed in the P-type well region 700, and 703 indicates $P^+$ semiconductor regions formed in the N-type well region 704. Although not particularly limited, the $P^+$ semiconductor regions 703 are formed at two portions in the N-type well 704. Reference numeral 701 indicates an $N^+$ region that is formed in the N-type well region 704 in a manner so as to surround the two $P^+$ regions 703. Reference numeral 702 indicates a separation region for separating the $P^+$ region 703 and the $N^+$ region 701 from each other, and in the present embodiment, is indicated as an STI. By using the $N^+$ region 701, an electric connection is made with the N-type well 704, and a diode element having a PN-junction is formed by the N-type well region 704 and $P^+$ region 703. By forming a plurality of the $P^+$ regions 703 as in the present embodiment, it is possible to widen the area of the PN-junction. That is, it is possible to lengthen the total opposing length between the anode and the cathode of the diode element.

The clamping capability of the discharge circuit 120 is desirably set to a high level, and for this reason, the total opposing length between the anode and the cathode is desirably made longer. For example, the total opposing length is desirably set to 100 μm or more. By using the configuration of the present embodiment, it is possible to obtain the total opposing length of 100 μm or more.

In FIG. 7(B), reference numeral 705 indicates a separation region for use in separating the plurality of N-type well regions 704, and in the present embodiment, an STI is used as the separation region. Additionally, in FIG. 7(A), the separation region 705 is omitted.

In FIG. 7(A) and FIG. 7(B), the $N^+$ region 701 in the diode element 506 shown on the right side and the $P^+$ region 703 in the diode element 507 shown on the left side are connected to the interrupting power-supply wiring VSSM1. Moreover, in FIG. 7(A) and FIG. 7(B), the $P^+$ region 703 in the diode element 506 shown on the right side and the $N^+$ region 701 in the diode element 507 shown on the left side are connected to the interrupting power-supply wiring VSSM2. With this arrangement, a discharge circuit capable of flowing a current in both directions can be formed.

The pair of diode elements 508 and 509 shown in FIG. 5 also has the configuration as explained with reference to FIG. 7(A) and FIG. 7(B).

In accordance with the present embodiment, even in the case when an interrupting power-supply wiring is provided so as to selectively interrupt the power supply, it is possible to prevent the potential difference between the gate and the source of the MOSFET that receives signals from the circuits that are operated by different power-supply voltages from becoming greatly larger in terms of time, and consequently to reduce the gate breakdown of the MOSFET. When considered from the viewpoint capable of reducing the gate breakdown, the discharge circuit 120 may be regarded as a gate protection circuit, or as the gate protection circuit that is effective in achieving the low power consumption.

Moreover, a clamp circuit as shown, for example, in FIG. 6 may be used as the discharge circuit 120, and in the present embodiment, the circuit is configured by using a pair of diode elements. For this reason, it is possible to suppress an increase in the occupied area due to an increased number of elements. Furthermore, since the layout of the pair of diode elements in the semiconductor chip 100 (FIG. 1) can be comparatively freely formed, it is possible to effectively utilize empty regions in the semiconductor chip.

Second Embodiment

FIG. 8 is a block diagram showing a configuration of a semiconductor integrated circuit device in accordance with a second embodiment. The configuration shown in FIG. 8 is similar to the configuration shown in FIG. 4, and those portions that are the same as those of FIG. 4 are indicated by the same reference numerals. The following description will mainly discuss portions different from them.

In the same manner as in FIG. 4, FIG. 8 shows a configuration formed on the analog macro region 114 shown in FIG. 1. In FIG. 8, reference numeral 803 indicates a circuit block corresponding to the circuit block 119 in FIG. 4, and 802 indicates a circuit block corresponding to the circuit block 118 in FIG. 4. That is, the circuit block 803 is an analog circuit, and the circuit block 802 is a digital circuit that receives a signal from the circuit block 803 serving as the analog circuit through a signal wiring 804. Reference numerals 800 and 801 indicate power-supply interrupting switch circuits, which correspond to the power-supply interrupting switch circuits 115 and 116 of FIG. 4. In the first embodiment, as shown in FIG. 4, the power-supply interrupting switch circuit is provided between the ground voltage and the circuit block. In contrast, in the second embodiment, the power-supply interrupting switch circuits 800 and 801 are provided between the power-supply voltage and the circuit block. That is, the power-supply interrupting switch circuit 800 is connected to between the power-supply voltage wiring 112 and the circuit block 802, and the power-supply interrupting switch circuit 801 is connected to between the power-supply voltage wiring 303 and the circuit block 803.

In FIG. 8, VDDM1 and VDDM2 are interrupting power-supply wirings corresponding to the VSSM1 and VSSM2 shown in FIG. 4. In also FIG. 8, each of the circuit blocks 802 and 803 is illustrated as one circuit block; however, in the same manner as in FIG. 4, each of the circuit blocks 802 and 803 includes a plurality of circuits. As shown in FIG. 3, the plurality of circuits are connected in parallel with one another between the interrupting power-supply wiring and the power-supply wiring. However, in the second embodiment shown in FIG. 8, the plurality of circuits included in each circuit block are connected not to between the power-supply voltage wirings 112, 303 and the interrupting power-supply wiring, but to between the ground voltage wirings 111, 302 and the interrupting power-supply wirings VDDM2, VDDM1, in parallel with one another.

In the same manner as in the power-supply interrupting switch circuits 115 and 116, the power-supply interrupting switch circuits 800 and 801 are respectively on/off-controlled by the control signal 121 (FIG. 1). Thus, during a period in which the circuit blocks 802 and 803 need not be operated, the power-supply interrupting switches 800 and 801 are turned off, thereby making it possible to reduce the power consumption.

In the present second embodiment, the discharge circuit 120 is connected to between the interrupting power-supply wiring VDDM1 and the interrupting power-supply wiring VDDM2, so that in the same manner as in the first embodiment, it is possible to reduce the gate breakdown of the MOSFET.

The power-supply interrupting switch circuits 800, 801 and the circuit blocks 802, 803, shown in FIG. 8, are configured by MOSFETs. Next, the following description will discuss circuits configured by the MOSFETs and operations thereof. FIG. 9 is a circuit diagram showing a circuit in the case when the block shown in FIG. 8 is configured by MOSFETs.

In FIG. 9, reference numerals 900 to 902 and 904 indicate P-FETs, and 903 and 905 indicate N-FETs. The circuit block 1 (803 in FIG. 8) includes the N-FET 905 of which the source and back gate are connected to the ground voltage wiring 302, and the P-FET 904 of which the drain is connected to the drain of the N-FET 905 and the back gate and source are connected to the interrupting power-supply wiring VDDM1. A signal is supplied to each of the gates of the N-FET 905 and the P-FET 904, and an output signal in response to the supplied signal is supplied to the circuit block 2 through the signal wiring 804. Additionally, the signal wiring 804 is connected to the drain of the N-FET 905 and the drain of the P-FET 904.

The circuit block 2 (802 in FIG. 8) includes the N-FET 903 of which the source and back gate are connected to the ground voltage wiring 111, and the P-FET 902 of which the drain is connected to the drain of the N-FET 903 and the back gate and source are connected to the interrupting power-supply wiring VDDM2. Although not particularly limited, the N-FET 903 and the P-FET 902 constitute an inverter circuit. That is, the gate of the P-FET 902 and the gate of the N-FET 903 are commonly connected to each other, and further connected to the above-mentioned signal wiring 804.

The power-supply interrupting switch circuit 801 (FIG. 8) includes the P-FET 901, and the power-supply interrupting switch circuit 800 (FIG. 8) includes the P-FET 900. The P-FET 901 constituting the power-supply interrupting switch circuit 801 has its source and back gate connected to the power-supply voltage wiring 303, and its drain connected to the interrupting power-supply wiring VDDM1. In the same manner, the P-FET 900 constituting the power-supply interrupting switch circuit 800 has its source and back gate connected to the power-supply voltage wiring 112, and its drain connected to the interrupting power-supply wiring VDDM2. The control signal 121 (FIG. 1) is supplied to the gates of these MOSFETs (P-FETs 900 and 901) for use in power-supply interruption, and these are selectively on/off-controlled in accordance with the control signal 121.

In the case when the MOSFET for use in power-supply interruption is set to an on-state by the control signal 121, a voltage in accordance with the power-supply voltage VDD1 is supplied to the interrupting power-supply wiring VDDM1, and a voltage in accordance with the power-supply voltage VDD2 is supplied to the interrupting power-supply wiring VDDM2. The voltage (VDD1) for use in operating the circuit block 1 serving as an analog circuit and the voltage (VDD2) for use in operating the circuit block 2 serving as a digital circuit have different voltage values. For this reason, upon operating the circuit blocks 1 and 2, power-supply voltages having different values are supplied to the circuit block 1 and the circuit block 2, so that the signal wiring 809 transmits a different power-supply bridging signal.

Even in the present embodiment, in the same manner as in the first embodiment, the clamp circuit 202 is connected to between the power-supply voltage wiring 303 and the ground voltage wiring 111, and the clamp circuit 201 is connected to between the power-supply voltage wiring 112 and the ground voltage wiring 302. Moreover, the clamp circuit 200 is connected to between the ground voltage wiring 111 and the ground voltage wiring 302. Even in the present embodiment, the clamp circuit 200 is provided with the pair of diode elements 508 and 509 that are connected so as to be forward directions in both directions, and can be regarded as a discharge circuit.

In the second embodiment, the discharge circuit 120 (FIG. 8) is connected to between the interrupting power-supply wiring VDDM1 and the interrupting power-supply wiring VDDM2. In the same manner as in the first embodiment, the discharge circuit 120 is provided with the pair of diode elements 506 and 507, and the pair of diode elements 506 and 507 is connected so as to be forward directions in both directions.

The following description will discuss operations in the case when in a CDM test, the semiconductor integrated circuit device is electrified, a terminal 105 is selected from a plurality of terminals (pins) as a selected terminal for use in the test, and a metal terminal is made in contact with the terminal 105, so that a ground voltage is applied to the terminal 105.

By the electrification of the semiconductor integrated circuit device, charges are accumulated in the power-supply voltage wiring, the ground voltage wiring, the signal wiring, the interrupting power-supply wiring and various nodes of the respective circuits. By applying the ground voltage to the selected terminal (pin) 105, the accumulated charge is made to flow into the test-use terminal (pin) 105 through a discharge path. FIG. 9 shows three types (1) to (3) of discharge paths to be described below among the discharge paths. That is, in the figure, a broken line 907 (1) with an arrow indicates a discharge path for discharging a charge accumulated in the interrupting power-supply wiring VDDM2. A broken line 906 (2) with an arrow indicates a discharge path for charges accumulated in the signal wiring 809 and the gates of the MOSFETs 902 and 903. In this case, the discharge path 906 forms a discharge path in the case when no discharge circuit 120 (FIG. 8) is provided, that is, no bidirectional diodes 506 and 507 are provided. A solid line 908 (3) with an arrow indicates a discharge path to be added when the discharge circuit 120 (bidirectional diodes 506 and 507) is provided, which forms a discharge path for discharging a charge accumulated in the interrupting power-supply wiring VDDM2.

In the discharge path 907, the charge accumulated in the source (interrupting power-supply wiring VDDM2) of the P-FET 902 is discharged to the terminal 105 through a parasitic diode in the P-FET 900 for use in power-supply interruption. In the discharge path 906, charges accumulated in the signal wiring 804 and the gates of the MOSFETs 902 and 903 are discharged to the terminal 105 through a parasitic diode in the P-FET 904, the P-FET 901 for use in power-supply interruption, the clamp circuit 202, the clamp circuit 200 (bidirectional diode elements 508 and 509) and the clamp circuit 201. Moreover, in the discharge path 507, charges accumulated in the signal wiring 804 and the gates of the MOSFETs 902 and 903 are discharged through a parasitic diode in the P-FET 904, the discharge circuit 120 (directional diode elements 506 and 507) and the P-FET 900 for use in power-supply interruption.

The potential in the source (interrupting power-supply wiring VDDM2) of the P-FET 902 is changed when the charge accumulated therein is discharged. In the same manner, the potential in the gate of the P-FET 902 is changed when the charges accumulated in the signal wiring 804 and the MOSFETs 902 and 903 are discharged. In these two discharges, when a great difference occurs in the discharge rate, a great potential difference occurs between the source and the gate of the P-FET 902 to lead to a gate breakdown.

In accordance with this embodiment, the discharge circuit 120 is connected to the interrupting power-supply wiring VDDM1. Thus, the discharge rate of charges accumulated in the signal wiring 804 and the MOSFETs 902 and 903 can be improved by the discharge path 120. That is, the discharge path 906 and the new discharge path 908 are added as the paths for discharging the charges accumulated in the signal wiring 804 and the MOSFETs 902 and 903. In the discharge path 906, since a plurality of circuit elements (904, 901, 202, 200 and 201) are interposed in the path, the change in the gate potential of the P-FET 902 is delayed. As a result, there is a concern that the potential difference between the source and gate becomes large. In accordance with the present embodiment, since the new discharge path is added by the discharge circuit 120, it is possible to prevent the potential difference between the gate and source of the P-FET 902 from becoming larger. That is, the discharge rate for discharging charges accumulated in the signal wiring 804 and the gates of the MOSFETs 902 and 903 can be improved, the difference from the discharge rate of the charge accumulated in the interrupting power-supply wiring VDDM2 can be made smaller, and with the result that it is possible to prevent the potential difference between the source and the gate of the P-FET 902 from becoming large. It is also possible to reduce the possibility of a gate breakdown of the MOSFET (P-FET 902) of which the gate receives a different power-supply bridging signal.

Third Embodiment

FIG. 10 is a block diagram showing a configuration of a semiconductor integrated circuit device in accordance with a third embodiment. The configuration of the block shown in FIG. 10 is similar to the configuration of that shown in FIG. 4 in the first embodiment. Therefore, those portions that are the same between FIG. 10 and FIG. 4 are indicated by the same reference numerals, and the explanation thereof will be omitted in this embodiment. The following description will discuss points different from those of the semiconductor integrated circuit device shown in FIG. 4.

In FIG. 4, the discharge circuit 120 is connected to between the interrupting power-supply wiring VSSM1 and the interrupting power-supply wiring VSSM2. In contrast, in the present embodiment, a discharge circuit 1000 is connected to between the power-supply voltage wiring 112 and the interrupting power-supply wiring VSSM1. Moreover, a discharge circuit 1001 is connected to between the power-supply voltage wiring 303 and the interrupting power-supply wiring VSSM2. As each of the discharge circuits 1000 and 1001, the clamp circuit shown in FIG. 6 is utilized. In this case, the terminal 606 of the clamp circuit shown in FIG. 6 is connected to the power-supply voltage wiring 112 (303), and the terminal 607 of the clamp circuit is connected to the interrupting power-supply wiring VSSM1 (VSSM2).

With this configuration, the charge accumulated in the interrupting power-supply wiring VSSM2 by electrification is discharged to the power-supply voltage wiring 303 (terminal 107) through the discharge circuit (clamp circuit) 1001, without passing through the power-supply interrupting switch circuit 115. Thus, the discharge rate of a charge accumulated in the interrupting power-supply wiring VSSM2 can be improved, and thus makes it possible to reduce the possibility of a gate breakdown in the MOSFET of which the gate receives a different power-supply bridging signal through the signal wiring 122. That is, it is possible to prevent the potential difference between the gate potential and the source potential of the MOSFET from becoming larger, and consequently to reduce the gate breakdown.

In FIG. 10, in order to deal with the case in which a different power-supply bridging signal is supplied from the circuit block 118 to the circuit block 119, the discharge circuit 1000 is connected to between the power-supply voltage wiring 112 and the interrupting power-supply wiring VSSM1. Also, in the discharge circuit 1000, the operations thereof are the same as those of the above-mentioned discharge circuit 1001. In this case, it is possible to reduce the possibility of a gate breakdown of the MOSFET included in the circuit block 119 due to the receipt of a different power-supply bridging signal from the circuit block 118.

Fourth Embodiment

FIG. 11 is a block diagram showing a configuration of a semiconductor integrated circuit device in accordance with a fourth embodiment. The semiconductor integrated circuit device shown in the figure is similar to the semiconductor integrated circuit device shown in FIG. 4, which has been explained in the first embodiment. Therefore, in FIG. 11, those portions that are the same as those of FIG. 4 are indicated by the same reference numerals, and the explanation thereof will be omitted in this embodiment. The following description will discuss points different from those of the semiconductor integrated circuit device shown in FIG. 4.

In the semiconductor integrated circuit device of FIG. 4, the power-supply interrupting switch circuits 115, 116 are connected to between the ground voltage wirings 111, 302 and the interrupting power-supply wirings VSSM2, VSSM1, and the circuit blocks 118, 119 are connected to between the power-supply voltage wirings 112, 303 and the interrupting power-supply wirings VSSM2, VSSM1. In contrast, in the present embodiment, the power-supply interrupting switch circuits 116, 115 are connected to between the power-supply voltage wirings 303, 112 and the interrupting power-supply wirings VDDM1, VDDM2. Moreover, the circuit blocks 119, 118 are connected to between the interrupting power-supply wirings VDDM1, VDDM2 and the ground voltage wirings 302, 111. In other words, in the present embodiment, the power-supply interrupting switch circuit is provided in the power-supply voltage (VDD1, VDD2) side. Accordingly, the MOSFETs (power-supply switch-use MOSFETs 505, 502 shown in FIG. 5) constituting the power-supply switch circuit are changed to P-FETs.

Further, in this embodiment, the discharge circuit 120 connected to between the interrupting power-supply wirings in FIG. 4 is omitted, a discharge circuit 1100 is connected to between the interrupting power-supply wiring VDDM2 and the ground voltage wiring 302, and a discharge circuit 1101 is connected to between the interrupting power-supply wiring VDDM1 and the ground voltage wiring 111. As the configuration of the discharge circuits 1100 and 1101, the configuration of the clamp circuit explained with reference to FIG. 6 is utilized. In this case, the terminal 606 of the clamp circuit shown in FIG. 6 is connected to the interrupting power-supply wiring VDDM2 (VDDM1), and the terminal 607 of the clamp circuit is connected to a ground voltage wiring 3023 (111).

In the present embodiment, charges accumulated in the interrupting power-supply wirings VDDM1, VDDM2 by electrification are discharged through the discharge circuits 1101, 1100, without passing through the power-supply interrupting switch circuits 116, 115. Thus, the discharge rate of charges accumulated in the interrupting power-supply wirings can be improved, and thus makes it possible to reduce the potential difference applied to between the gate and source of the MOSFET that receives a different power-supply bridging signal through the signal wiring 122. As a result, it becomes possible to reduce the possibility of a gate breakdown in the MOSFET. Additionally, FIG. 11 shows a state in which a different power-supply bridging signal is supplied from the circuit block 118 to the circuit block 119, or from the circuit block 119 to the circuit block 118, through the signal wiring 122.

Fifth Embodiment

FIG. 12 is a circuit diagram showing a configuration of a semiconductor integrated circuit device in accordance with a fifth embodiment. The semiconductor integrated circuit device shown in FIG. 12 is similar to the semiconductor integrated circuit device explained with reference to FIG. 5 in the first embodiment. Therefore, the same portions are indicated by the same reference numerals, and the explanation thereof will be omitted in this embodiment. The following description will discuss points different from FIG. 5.

In the present embodiment, the circuit for generating the different power-supply bridging signal is changed. That is, the circuit block 1 for generating the different power-supply bridging signal is connected to the ground voltage wiring 302, without passing through the power-supply interrupting switch circuit. In other words, the circuit block 1 is disposed outside the power-supply interrupting region, and is set to, for example, a constantly operated state. In this case, the bidirectional diode elements 506 and 507 constituting the discharge circuit 120 (FIG. 4) are connected to between the interrupting power-supply wiring VSSM2 and the ground voltage wiring 302.

Even in the present embodiment, in the case when a ground voltage is applied to the terminal (pin) 107 after having been electrified, in the same manner as explained in FIG. 5, discharge paths indicated by broken lines 1411, 1412 with arrows and a solid line 510 with an arrow are formed. Since the discharge path 510 is formed by the discharge circuit 120 (bidirectional diode elements 506 and 507), it is possible to prevent the potential difference between the gate and source in the N-FET 501 that receives the different power-supply bridging signal from becoming larger, and consequently to reduce the generation of a gate breakdown.

Sixth Embodiment

FIG. 13 is a circuit diagram showing a configuration of a semiconductor integrated circuit device in accordance with a sixth embodiment. The semiconductor integrated circuit device of this embodiment is similar to the semiconductor integrated circuit device of FIG. 9, which has been explained in the second embodiment. Therefore, those portions that are the same as those of FIG. 9 are indicated by the same reference numerals, and the explanation thereof will be omitted in this embodiment. The following description will discuss points different from FIG. 9.

In the present embodiment, the configuration of the circuit for generating the different power-supply bridging signal is changed. That is, the circuit block 1 which includes a circuit for generating the different power-supply bridging signal is connected to the power-supply voltage wiring 303, without passing through a MOSFET for use in power-supply interrupting switch. In other words, the circuit block 1 is disposed outside the power-supply interrupting region, and is set, for example, to be constantly operated. In the embodiment shown in FIG. 9, the bidirectional diode elements 506 and 507 constituting the discharge circuit 120 (FIG. 8) are connected to between the interrupting power-supply wirings; however, in the present embodiment, they are connected to between the power-supply voltage wiring 303 and the interrupting power-supply wiring VDDM2.

Thus, even when a ground voltage is applied to the terminal (pin) 105 after electrification, discharge paths indicated by broken lines 906 and 907 with arrows and a solid line 908 with an arrow are also formed. That is, also in this case, since the discharge path 908 is formed by the discharge circuit 120, it is possible to prevent the potential difference between the gate and source of the P-FET 902 of which the gate receives a different power-supply bridging signal from becoming larger, and consequently to reduce the gate breakdown. Additionally, the discharge path 906 in this case corresponds to a path in which the P-FET 901 for use in power-supply interruption Is omitted from the discharge path 906 in FIG. 9.

In FIG. 7(A) and FIG. 7(B), the configuration for separating the P-type semiconductor region and the N-type semiconductor region from each other by using an STI has been explained as the diode element constituting the discharge circuit; however, the present invention is not limited to this configuration. For example, a diode element having such a configuration (gate separation type) which separates the P-type semiconductor region and the N-type semiconductor region by using a gate electrode of an MOSFET may be used. For example, a diode element formed by an N$^+$ semiconductor region and a P-type well by using an STI separation, or a diode element formed by a P$^+$ semiconductor region and an N-type well by using the STI separation may be used as the diode element. Moreover, a diode element formed by the N$^+$ semiconductor region and the P-type well by the separation using a gate electrode, or a diode element formed by the P$^+$ semiconductor region and the N-type well by the separation using a gate electrode may be used. Furthermore, a diode element formed by the P-type well and the N-type well may be used.

The above explanation has been given by exemplifying the CDM test; however, upon transporting the semiconductor integrated circuit device, or other processes, the semiconductor integrated circuit device is electrified. When metal is made in contact with the terminal (pin) 105 or the like in the electrified state, the ground potential might be applied to the terminal (pin) 105 in some cases. For this reason, the present invention is effectively used for the gate protection upon handling the semiconductor integrated circuit device. Moreover, the explanation has been given by exemplifying a case where a different power-supply bridging signal is transmitted between an analog circuit and a digital circuit; however, the present invention is not limited to this case. The present invention may be applied to a case where the different power-supply bridging signal is transmitted between the digital circuits or between the analog circuits. Of course, the present invention may be applied to a circuit inside a core logic region shown in FIG. 1.

The present invention is not limited to the foregoing embodiments and but includes various modification examples. For example, the above-described first to sixth embodiments has concretely described the present invention so that the present invention can be easily understood, and thus the present invention is not necessarily limited to the one including all the configurations described in the foregoing. Part of the configuration of a certain embodiment can be replaced by the configuration of another embodiment, and the configuration of the other embodiment can be added to the configuration of the certain embodiment. Moreover, part of the configuration of the embodiment can be subjected to addition/deletion/replacement of other configurations.

EXPLANATION OF REFERENCE NUMERALS

115, 116 power-supply interrupting switch circuit
118 circuit block 2
119 circuit block 1
120 discharge circuit
200 clamp circuit 3
201 clamp circuit 2
202 clamp circuit 3
VSSM1, VSSM2 interrupting power-supply wiring

The invention claimed is:
1. A semiconductor integrated circuit device comprising:
a first terminal to which a first voltage is applied;
a second terminal to which a second voltage different from the first voltage is applied;
a third terminal to which a third voltage different from the first voltage and the second voltage is applied;
a first wiring that is selectively and electrically connected to the third terminal;
a first circuit that is connected to the second terminal and receives the second voltage as an operational voltage to form an output signal;
a second circuit that is connected to the first terminal and the first wiring, and operated by a differential voltage between the first voltage and a voltage in the first wiring, and receives the output signal formed in the first circuit through a signal wiring;
a first discharge circuit that is connected to the first wiring to discharge a charge;
a switch circuit that is connected to between the third terminal and the first wiring, and selectively supplies the third voltage to the first wiring; and
a clamp circuit that is connected to between the third terminal and the second terminal,
wherein the second circuit includes a plurality of circuits that are connected in parallel with one another between the first wiring and the first terminal, with one of the plurality of circuits being provided with an MOSFET having the signal wiring connected to a gate thereof and one electrode thereof connected to the first wiring.

2. A semiconductor integrated circuit device comprising:
a first terminal to which a first voltage is applied;
a second terminal to which a second voltage different from the first voltage is applied;
a third terminal to which a third voltage different from the first voltage and the second voltage is applied;
a first wiring that is selectively and electrically connected to the third terminal;
a first circuit that is connected to the second terminal and receives the second voltage as an operational voltage to form an output signal;
a second circuit that is connected to the first terminal and the first wiring, and operated by a differential voltage between the first voltage and a voltage in the first wiring, and receives the output signal formed in the first circuit through a signal wiring;
a first discharge circuit that is connected to the first wiring to discharge a charge;

a fourth terminal that is different from the first terminal, the second terminal and the third terminal; and a second wiring which is selectively connected to the fourth terminal and to which a voltage in accordance with a fourth voltage to be applied to the fourth terminal is supplied, wherein the first circuit is operated by a differential voltage between the second voltage and a voltage in the second wiring, and the first discharge circuit is a discharge circuit having a pair of terminals, with one of the terminals being connected to the first wiring and the other terminal being connected to the second wiring, and discharging a charge in both directions between the pair of terminals.

3. A semiconductor integrated circuit device comprising:
a first terminal to which a first voltage is applied;
a second terminal to which a second voltage different from the first voltage is applied;
a third terminal to which a third voltage different from the first voltage and the second voltage is applied;
a first wiring that is selectively and electrically connected to the third terminal;
a first circuit that is connected to the second terminal and receives the second voltage as an operational voltage to form an output signal;
a second circuit that is connected to the first terminal and the first wiring, and operated by a differential voltage between the first voltage and a voltage in the first wiring, and receives the output signal formed in the first circuit through a signal wiring;
a first discharge circuit that is connected to the first wiring to discharge a charge;
a fifth terminal that is different from the first terminal, the second terminal and the third terminal;
a third wiring which is selectively connected to the fifth terminal and to which a voltage in accordance with a fifth voltage to be applied to the fifth terminal is supplied; and
a second discharge circuit that is connected to the third wiring to discharge a charge,
wherein the first circuit is operated by a differential voltage between the second voltage and a voltage in the third wiring,
the first discharge circuit is a discharge circuit having a pair of terminals, with one of the terminals being connected to the first wiring and the other terminal being connected to the second terminal, and discharging a charge in both directions between the pair of terminals, and
the second discharge circuit is a discharge circuit having a pair of terminals, with one of the terminals being connected to the third wiring and the other terminal being connected to the first terminal, and discharging a charge in both directions between the pair of terminals.

4. A semiconductor integrated circuit device comprising:
a first terminal to which a first voltage is applied;
a second terminal to which a second voltage different from the first voltage is applied;
a third terminal to which a third voltage different from the first voltage and the second voltage is applied;
a first wiring that is selectively and electrically connected to the third terminal;
a first circuit that is connected to the second terminal and receives the second voltage as an operational voltage to form an output signal;
a second circuit that is connected to the first terminal and the first wiring, and operated by a differential voltage between the first voltage and a voltage in the first wiring, and receives the output signal formed in the first circuit through a signal wiring;
a first discharge circuit that is connected to the first wiring to discharge a charge; and
a sixth terminal that is different from the first terminal, the second terminal and the third terminal,
wherein the first circuit is operated by a differential voltage between the second voltage and a voltage in the sixth terminal, and
the first discharge circuit is a discharge circuit having a pair of terminals, with one of the terminals being connected to the first wiring and the other terminal being connected to the sixth terminal, and discharging a charge in both directions between the pair of terminals.

5. The semiconductor integrated circuit device according to claim 2, further comprising:
a clamp circuit connected to between the first terminal and the fourth terminal; and
a clamp circuit connected to between the second terminal and the third terminal.

6. The semiconductor integrated circuit device according to claim 5, further comprising:
a discharge circuit connected to between the third terminal and the fourth terminal.

7. The semiconductor integrated circuit device according to claim 3, further comprising:
a clamp circuit connected to between the first terminal and the fifth terminal; and
a clamp circuit connected to between the second terminal and the third terminal.

8. The semiconductor integrated circuit device according to claim 4, further comprising:
a clamp circuit connected to between the first terminal and the sixth terminal; and
a clamp circuit connected to between the second terminal and the third terminal.

9. The semiconductor integrated circuit device according to claim 8, further comprising:
a discharge circuit connected to between the third terminal and the sixth terminal.

10. The semiconductor integrated circuit device according to claim 2,
wherein the second circuit includes a plurality of circuits that are connected in parallel with one another between the first wiring and the first terminal, with one of the plurality of circuits being provided with an MOSFET having the signal wiring connected to a gate thereof and one electrode thereof connected to the first wiring.

11. The semiconductor integrated circuit device according to claim 2,
wherein the discharge circuit includes a pair of diode elements each of which has an anode and a cathode, with the anode of one of the diode elements being connected to the cathode of the other diode element, and with the cathode of one of the diode elements being connected to the anode of the other diode element.

* * * * *